US012740094B2

(12) United States Patent
Tanaka et al.

(10) Patent No.: US 12,740,094 B2
(45) Date of Patent: Sep. 15, 2026

(54) SILICON CARBIDE SEMICONDUCTOR DEVICE AND POWER CONVERTER

(71) Applicant: Mitsubishi Electric Corporation, Tokyo (JP)

(72) Inventors: Takanori Tanaka, Tokyo (JP); Yuichi Nagahisa, Tokyo (JP); Naoyuki Kawabata, Tokyo (JP); Hiroyuki Amishiro, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 868 days.

(21) Appl. No.: 17/918,115

(22) PCT Filed: May 29, 2020

(86) PCT No.: PCT/JP2020/021346
§ 371 (c)(1),
(2) Date: Oct. 11, 2022

(87) PCT Pub. No.: WO2021/240782
PCT Pub. Date: Dec. 2, 2021

(65) Prior Publication Data

US 2023/0133459 A1 May 4, 2023

(51) Int. Cl.
*H10D 30/66* (2025.01)
*H02P 27/08* (2006.01)
*H10D 62/832* (2025.01)

(52) U.S. Cl.
CPC ....... *H10D 30/665* (2025.01); *H10D 62/8325* (2025.01); *H02P 27/08* (2013.01)

(58) Field of Classification Search
CPC . H10D 30/665; H10D 62/8325; H10D 62/117
See application file for complete search history.

(56) References Cited

U.S. PATENT DOCUMENTS 5,945,691 A 8/1999 Tomomatsu et al.
10,355,084 B1 7/2019 Nishi et al.
(Continued)

FOREIGN PATENT DOCUMENTS

DE 10330571 A1 2/2005
DE 102011076243 A1 12/2011
(Continued)

OTHER PUBLICATIONS

International Search Report and Written Opinion mailed on Aug. 25, 2020, received for PCT Application PCT/JP2020/021346, filed on May 29, 2020, 9 pages including English Translation.
(Continued)

*Primary Examiner* — Samuel A Gebremariam
*Assistant Examiner* — Jonas T Beardsley
(74) *Attorney, Agent, or Firm* — XSENSUS LLP

(57) ABSTRACT

Fluctuations in device characteristics are suppressed by suppressing local occurrences of a large current through a body diode of a field-effect transistor. A silicon carbide semiconductor device includes a silicon carbide semiconductor substrate, a semiconductor layer formed on the upper surface of the silicon carbide semiconductor substrate, and a backside electrode formed on the lower surface of the silicon carbide semiconductor substrate. A region in which electric resistivity takes a first value is regarded as a first resistance region, and a region where the electric resistivity takes a second value greater than the first value is regarded as a second resistance region. The second resistance region extends across a region boundary, i.e., the boundary between the active region and the termination region, in plan view.

14 Claims, 12 Drawing Sheets

(56) References Cited

U.S. PATENT DOCUMENTS

2005/0035405 A1 2/2005 Mauder et al.
2009/0289276 A1 11/2009 Yoshiura et al.
2011/0291223 A1 12/2011 Nakamura
2015/0041965 A1* 2/2015 Schulze ............... H10D 62/115 438/478
2016/0064547 A1* 3/2016 Siemieniec .......... H10D 62/107 257/329
2016/0155796 A1 6/2016 Basler et al.
2016/0197149 A1* 7/2016 Sakai ....................... H10D 8/60 257/77
2020/0194554 A1* 6/2020 Adachi ................ H10D 62/307
2020/0251587 A1* 8/2020 Fischer .................. H10D 8/411
2020/0357883 A1* 11/2020 Pfaffenlehner ...... H10D 62/393

FOREIGN PATENT DOCUMENTS

DE 102014116759 A1 5/2016
DE 102019201740 A1 8/2019
JP 8-316480 A 11/1996
JP 9-36388 A 2/1997
JP 2009-283781 A 12/2009

OTHER PUBLICATIONS

Agarwal et al., “A New Degradation Mechanism in High-Voltage SiC Power MOSFETs”, IEEE Electron Device Letters, vol. 28, No. 7, Jul. 2007, pp. 587-589.
Tawara et al., “Short minority carrier lifetimes in highly nitrogen-doped 4H—SiC epilayers for suppression of the stacking fault formation in PiN diodes”, Journal of Applied Physics, vol. 120, 2016, pp. 115101-1-115101-7.
Office Action dated Feb. 4, 2026 in corresponding German patent application No. DE112020007260.6 (16 pages; with English translation).

* cited by examiner

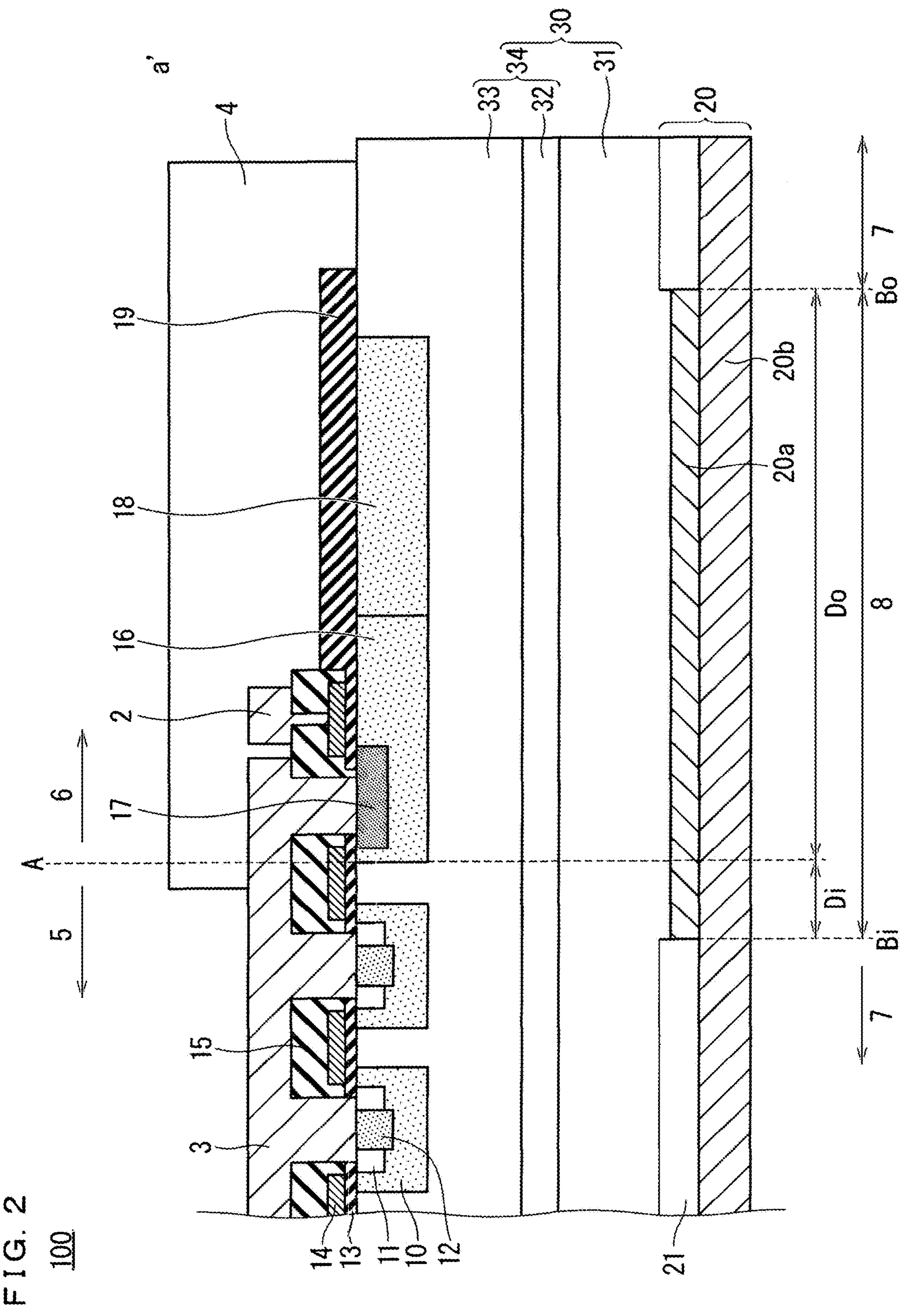
F I G. 2
100
a
a'
A
5
6
7
8
Bi
Bo
Di
Do
2
3
4
10
11
12
13
14
15
16
17
18
19
20
20a
20b
21
30
31
32
33
34

F I G. 3
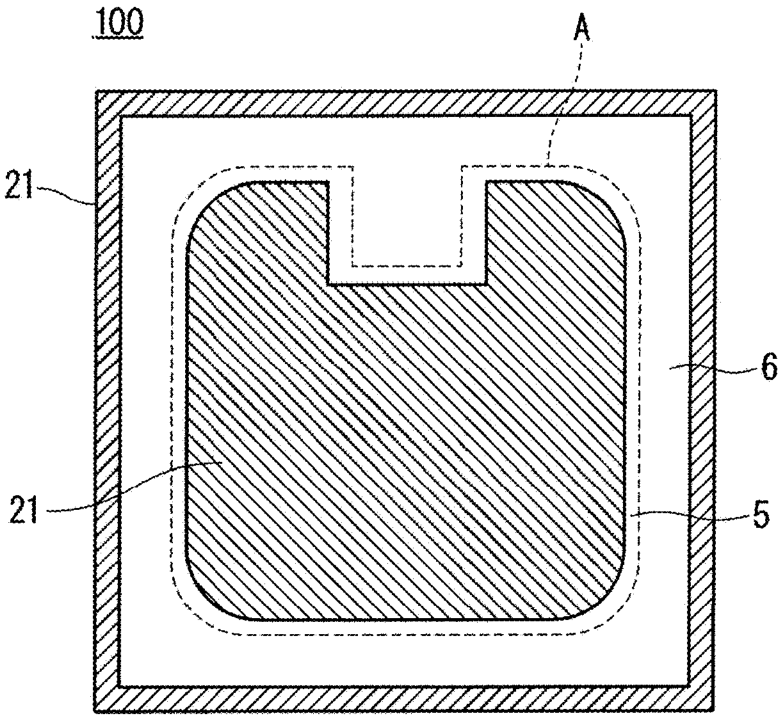
F I G. 4
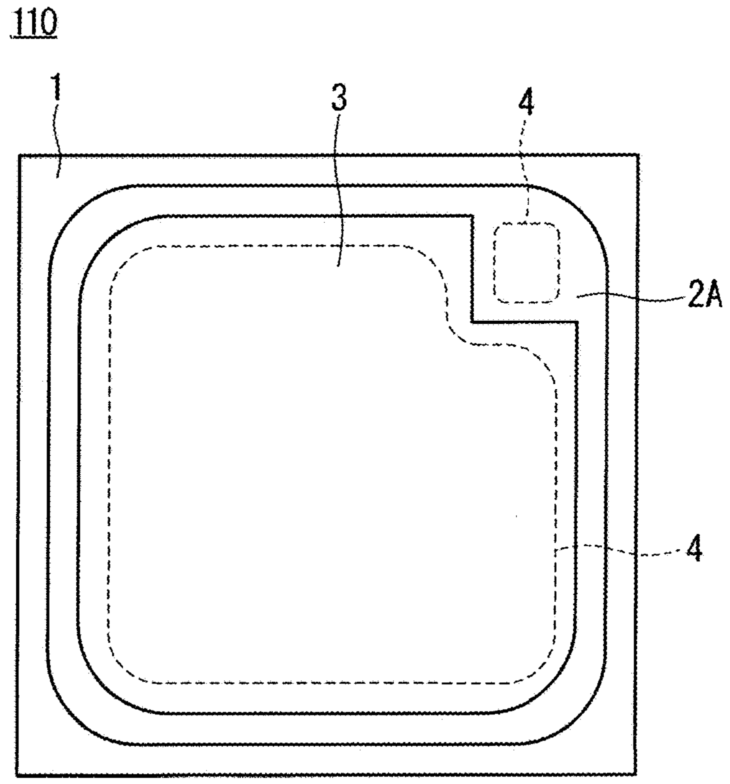

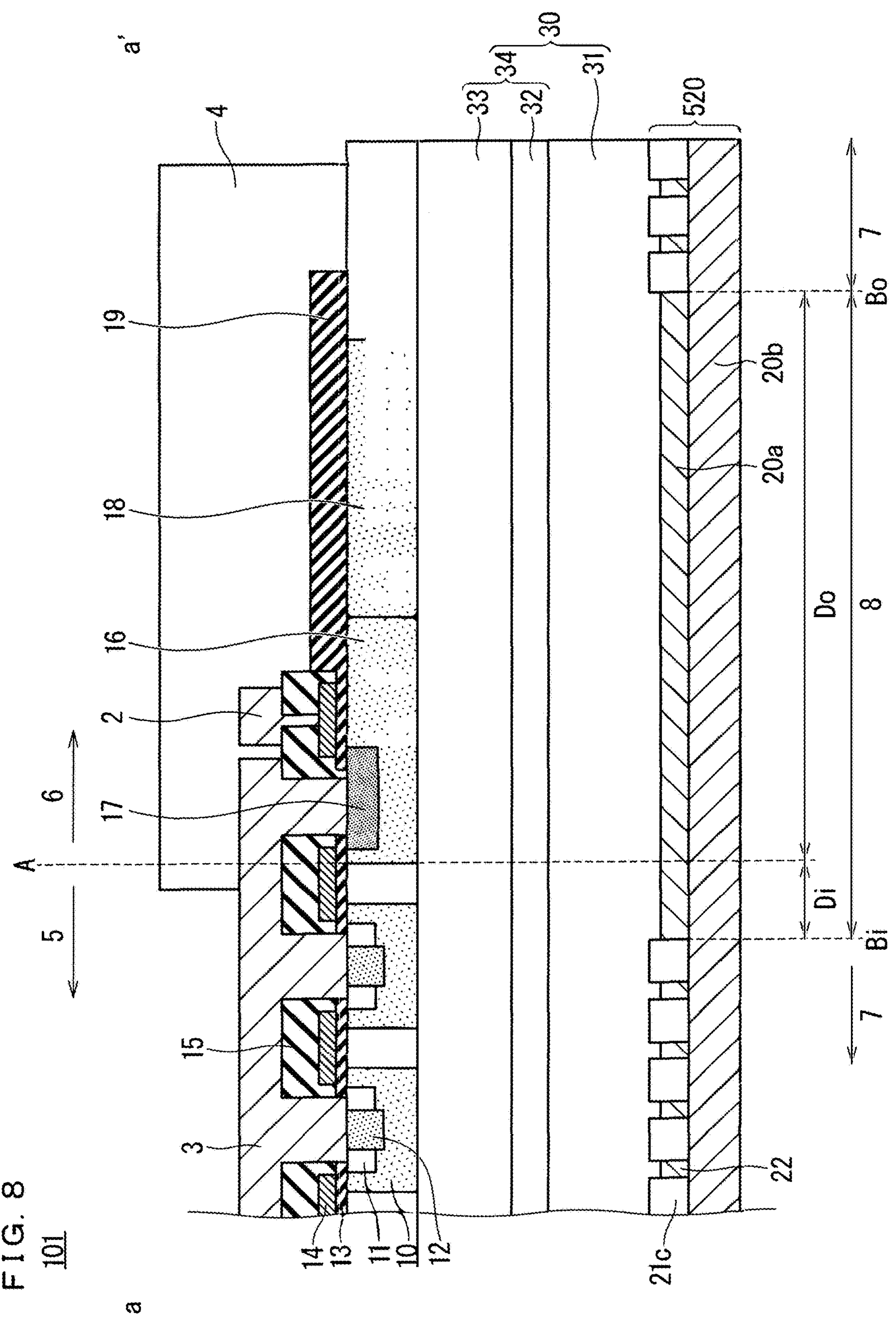
F I G. 8
101
a
a'
4
30
34
33
32
31
520
19
18
16
2
17
15
3
14
13
11
10
12
21c
22
20a
20b
A
5
6
7
8
Do
Di
Bo
Bi

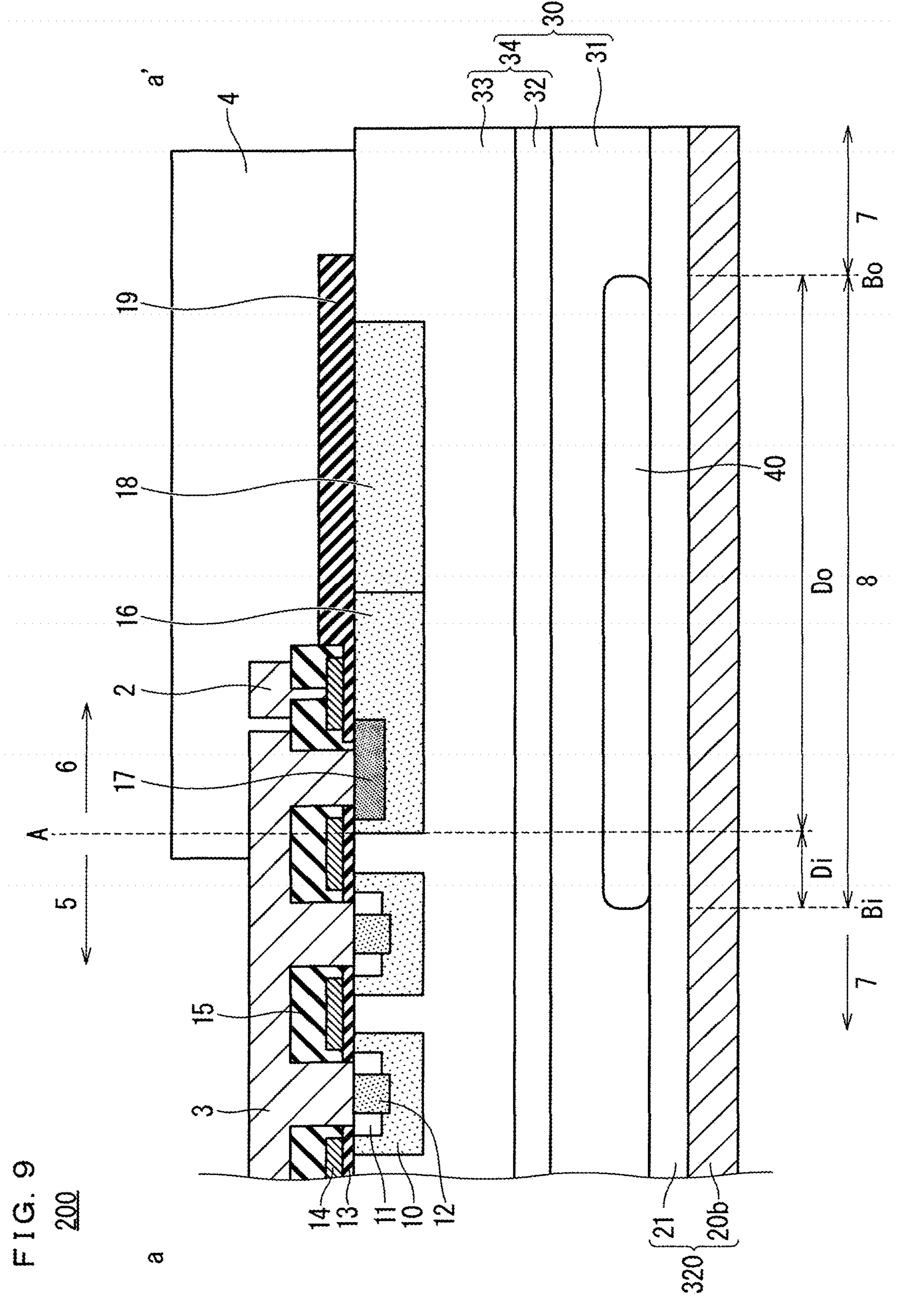
F I G. 9
200
a
a'
A
5
6
7
8
Bo
Bi
Do
Di
2
3
4
10
11
12
13
14
15
16
17
18
19
21
20b
320
30
31
32
33
34
40

201
a
a'
4
33
32
31
34
30
20
19
18
16
2
6
A
5
17
15
3
14
13
11
10
12
21
20b
320
40a
40b
40c
40d
340
Do
Di
Bo
Bi
7
8
7

300
a
a'
4
19
18
16
2
17
6
A
5
15
3
14
13
11
10
12
33
32
31
34
30
21
420
620
7
Bo
Do
8
Di
Bi 301
a
a'
A
5
6
2
3
4
10
11
12
13
14
15
16
17
18
19
30
31
32
33
34
720
721
722
7
8
Bo
Bi
Do
Di

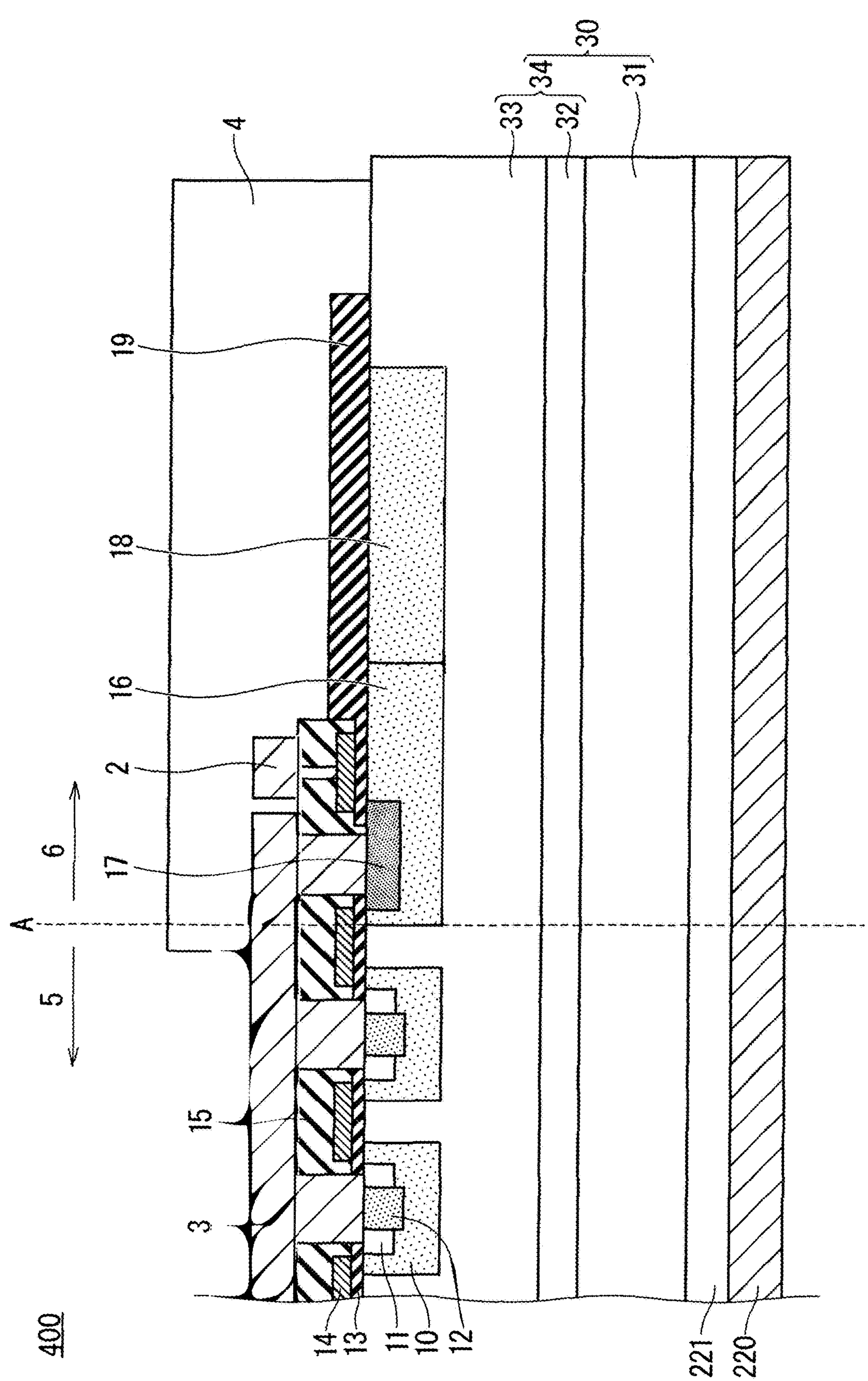
F I G. 1 4
400
4
19
18
16
2
6
17
A
5
15
3
14
13
11
10
12
30
34
33
32
31
221
220

SILICON CARBIDE SEMICONDUCTOR DEVICE AND POWER CONVERTER

CROSS-REFERENCE TO RELATED APPLICATION

The present application is based on PCT filing PCT/JP2020/021346, filed May 29, 2020, the entire contents of which are incorporated herein by reference.

TECHNICAL FIELD

The technique disclosed in the specification of the present application relates to a silicon carbide semiconductor device and a power converter.

BACKGROUND ART

Wide-gap semiconductor materials such as silicon carbide (SiC) have higher dielectric breakdown strength than silicon (Si) materials. Thus, using a wide-gap semiconductor material as a substrate material allows the substrate to have a higher impurity concentration and lower resistance than in the case of using a silicon material. The reduction in the resistance of the substrate can reduce losses during switching operations of a power device. Also, as compared with silicon materials, wide-gap semiconductor materials have higher thermal conductivity and superior mechanical strength, and therefore they are expected to serve as materials capable of realizing compact, low-loss, and high-efficiency power devices.

It is known that metal-oxide-semiconductor field-effect transistors (i.e., MOSFETs) using silicon carbide (hereinafter, also referred to as "SiC-MOSFETs") include a parasitic diode called a body diode between source and drain, and when a forward current flows through the parasitic diode, fluctuations will occur in the resistance value of the device (see Non-Patent Document 1, for example).

This is because recombination energy generated by recombination of minority carriers injected through the body diode with major carriers extends stacking faults, i.e., plane defects, starting from, for example, basal plane dislocations from the silicon carbide substrate.

For example, Non-Patent Document 2 discloses a method for preventing the extension of stacking faults starting from basal plane dislocations from a silicon carbide substrate by forming a buffer layer on the silicon carbide substrate to facilitate the recombination of holes and electrons in the buffer layer.

PRIOR ART DOCUMENTS

Non-Patent Documents

Non-Patent Document 1: IEEE ELECTRON DEVICE LETTERS, VOL. 28, NO. 7, "A New Degradation Mechanism in High-Voltage SiC Power MOSFETs," JULY 2007

Non-Patent Document 2: Journal of Applied Physics, "Short minority carrier lifetimes in highly nitrogen-doped 4H—SiC epilayers for suppression of the stacking fault formation in PiN diodes," Vol. 120, pp. 115101, 2016

SUMMARY

Problem to be Solved by the Invention

The structure adopting the buffer layer as described in Non-Patent Document 2, however, needs to have a considerably thick buffer layer if it includes regions where a large current occurs. This is disadvantageous from the viewpoint of productivity. Moreover, Non-Patent Document 2 fails to disclose a case in which a large current occurs in the body diode of the field-effect transistor.

The technique disclosed in the specification of the present application has been made in view of the problems as described above and serves as a technique for suppressing fluctuations in device characteristics when a large current occurs in the body diode of a field-effect transistor.

Means to Solve the Problem

A first aspect of the technique disclosed in the specification of the present application relates to a silicon carbide semiconductor device that includes a silicon carbide semiconductor substrate of a first conductivity type, a semiconductor layer of the first conductivity type formed on an upper surface of the silicon carbide semiconductor substrate, and a backside electrode formed on a lower surface of the silicon carbide semiconductor substrate. A region in which a field-effect transistor is formed in a surface layer of the semiconductor layer and on an upper surface of the semiconductor layer is regarded as an active region. A region that surrounds the active region in plan view is regarded as a termination region. A region in which electric resistivity between the silicon carbide semiconductor substrate and the backside electrode takes a first value is regarded as a first resistance region. A region in which the electric resistivity between the silicon carbide semiconductor substrate and the backside electrode takes a second value greater than the first value is regarded as a second resistance region. The second resistance region is a region that extends across a region boundary in plan view, the region boundary being a boundary between the active region and the termination region.

A second aspect of the technique disclosed in the specification of the present application relates to a silicon carbide semiconductor device that includes a silicon carbide semiconductor substrate, a semiconductor layer formed on an upper surface of the silicon carbide semiconductor substrate, and a backside electrode formed on part of a lower surface of the silicon carbide semiconductor substrate. A region in which a field-effect transistor is formed in a surface layer of the semiconductor layer and on an upper surface of the semiconductor layer is regarded as an active region. A region that surrounds the active region in plan view is regarded as the termination region. A region in which the backside electrode is formed in plan view is regarded as a first region. A region in which the backside electrode is not formed in plan view is regarded as a second region. The second region is a region that extends across a region boundary in plan view, the region boundary being a boundary between the active region and the termination region.

A third aspect of the technique disclosed in the specification of the present application relates to a power converter that includes a conversion circuit that includes the silicon carbide semiconductor device described above and converts and outputs input electric power, a driving circuit that outputs a driving signal for driving the silicon carbide semiconductor device to the silicon carbide semiconductor device, and a control circuit that outputs a control signal for controlling the driving circuit to the driving circuit.

Effects of the Invention

The first aspect of the technique disclosed in the specification of the present application includes a silicon carbide semiconductor substrate of a first conductivity type, a semiconductor layer of the first conductivity type formed on an upper surface of the silicon carbide semiconductor substrate, and a backside electrode formed on a lower surface of the silicon carbide semiconductor substrate. A region in which a field-effect transistor is formed in a surface layer of the semiconductor layer and on an upper surface of the semiconductor layer is regarded as an active region. A region that surrounds the active region in plan view is regarded as a termination region. A region in which electric resistivity between the silicon carbide semiconductor substrate and the backside electrode takes a first value is regarded as a first resistance region. A region in which the electric resistivity between the silicon carbide semiconductor substrate and the backside electrode takes a second value greater than the first value is regarded as a second resistance region. The second resistance region is a region that extends across a region boundary in plan view, the region boundary being a boundary between the active region and the termination region. This configuration suppresses local occurrences of a large current in the vicinity of the boundary between the active region and the termination region and accordingly suppresses fluctuations in device characteristics.

The second aspect of the technique disclosed in the specification of the present application includes a silicon carbide semiconductor substrate, a semiconductor layer formed on an upper surface of the silicon carbide semiconductor substrate, and a backside electrode formed on part of a lower surface of the silicon carbide semiconductor substrate. A region in which a field-effect transistor is formed in a surface layer of the semiconductor layer and on an upper surface of the semiconductor layer is regarded as an active region. A region that surrounds the active region in plan view is regarded as the termination region. A region in which the backside electrode is formed in plan view is regarded as a first region. A region in which the backside electrode is not formed in plan view is regarded as a second region. The second region is a region that extends across a region boundary in plan view, the region boundary being a boundary between the active region and the termination region. This configuration suppresses local occurrences of a large current in the vicinity of the boundary between the active region and the termination region and accordingly suppresses fluctuations in device characteristics.

The third aspect of the technique disclosed in the specification of the present application relates to the power converter that includes a conversion circuit that includes the silicon carbide semiconductor device described above and converts and outputs input electric power, a driving circuit that outputs a driving signal for driving the silicon carbide semiconductor device to the silicon carbide semiconductor device, and a control circuit that outputs a control signal for controlling the driving circuit to the driving circuit. This configuration suppresses local occurrences of a large current in the vicinity of the boundary between the active region and the termination region in the silicon carbide semiconductor device included in the power converter, and accordingly suppresses fluctuations in device characteristics.

The objects, features, aspects and advantages of the technique disclosed in the specification of the present application will become more apparent from the following detailed description and the accompanying drawings.

BRIEF DESCRIPTION OF DRAWINGS

FIG. 2 is a sectional view schematically showing an example of a configuration of a peripheral portion of the SiC-MOSFET according to the embodiment.

FIG. 3 is a plan view showing an example of a region in which an ohmic contact region is formed, according to the embodiment.

FIG. 4 is a plan view schematically illustrating a variation of the configuration of the SiC-MOSFET according to the embodiment.

FIG. 8 is a sectional view schematically illustrating a variation of the configuration of the peripheral portion of the SiC-MOSFET according to the embodiment.

FIG. 9 is a sectional view schematically illustrating an example of a configuration of the peripheral portion of an SiC-MOSFET according to one embodiment.

FIG. 14 is a sectional view schematically showing an example of a configuration of an SiC-MOSFET known by the inventors.

DESCRIPTION OF EMBODIMENTS

Figure 1:
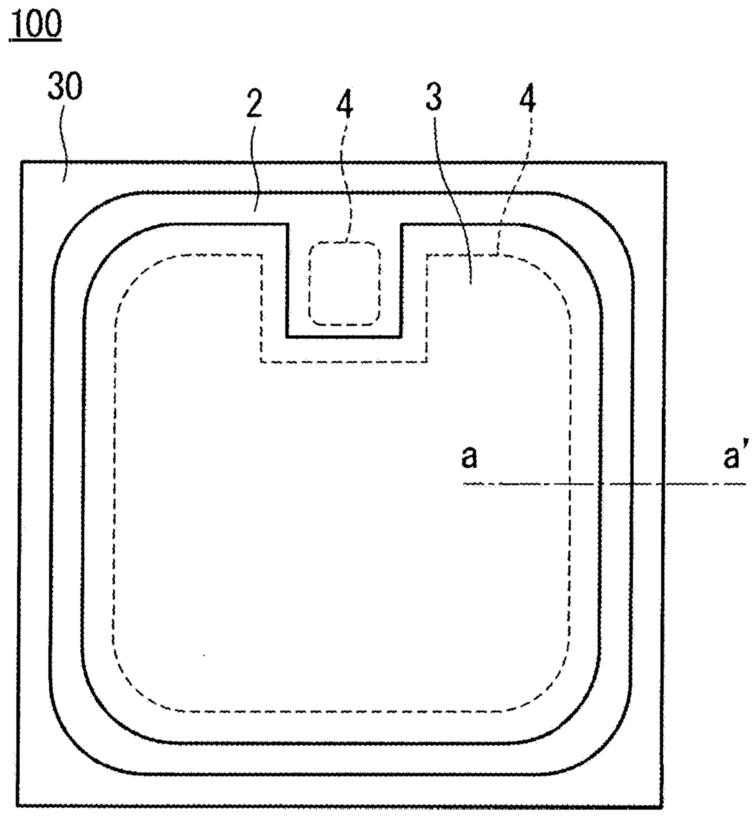
FIG. 1 is a plan view schematically showing an example of a configuration of an SiC-MOSFET according to one embodiment.

Embodiments will be described hereinafter with reference to the accompanied drawings. In the following embodiments, detailed features and the like are also described for explanation of technology, but they are merely illustrative, and not all of them are absolutely indispensable features necessary to implement the embodiments.

Note that the drawings are given in schematic form, and configurations may be omitted or simplified as appropriate in the drawings for convenience in description. Mutual relationships in size and position among configurations and the like illustrated in different drawings are not always accurate and may be changed as appropriate. To facilitate understanding of the contents of embodiments, hatching may be given to any drawing such as a plan view other than sectional views.

In the following description, similar constituent elements shall be given the same reference signs in the drawings and assumed to have similar names and functions. Therefore, detailed description of such constituent elements may be omitted in some cases in order to avoid redundancy.

In the following description, unless otherwise specified, phrases such as "include, contain, or have given constituent elements" are not mutually exclusive expressions that eliminate the possibility of the presence of other constituent elements.

In the following description, the ordinal numbers such as "first" and "second" may be used in some cases, but they are merely used for convenience to facilitate understanding of the contents of embodiments and do not intend to limit any order to an order indicated by these ordinal numbers.

In the following description, unless otherwise specified, phrases that indicate equivalent states such as "same," "equal," "uniform," and "homogeneous" are assumed to include cases such as being in a strictly equivalent state and being in a state in which some differences may exist within tolerance or within a range in which comparative functions can be achieved.

In the following description, terms such as "upper," "lower," "left," "right," "side," "bottom," "front," and "back" that mean specific positions or directions may be used in some cases, but these terms are merely used for convenience to facilitate understanding of the contents of embodiments and may not relate to positions or directions in the actual implementation.

In the following description, phrases such as "the upper or lower surface of" refer to not only the upper or lower surface itself of a target constituent element, but also refer to a state in which any other constituent element may be formed in/on the upper or lower surface of a target constituent element. That is, for example, a phrase "a constituent element A provided on the upper surface of a constituent element B" does not eliminate the possibility that another constituent element C exists between the constituent elements A and B. Similarly, for example, a phrase "a constituent element A covers a constituent element B" does not eliminate the possibility that another constituent element "C" exists between the constituent elements A and B.

First Embodiment

A silicon carbide semiconductor device according to one embodiment of the present invention will be described hereinafter.

In the following description, an "active region" of the semiconductor device refers to a region through which a principal current flows in the ON state of the semiconductor device, and a "termination region" of the semiconductor device refers to a region that is located around the active region. A phrase "outward" of the semiconductor device refers to a direction from a central portion of the semiconductor device toward the outer periphery thereof, and a phrase "inward" of the semiconductor device refers to a direction directed opposite to the "outward" direction. Although the description is given assuming that a "first conductivity type of impurities" refers to an n type and a "second conductivity type of impurities" refers to a p type, but conversely, the "first conductivity type of impurities" may refer to the p type and the "second conductivity type of impurities" may refer to the n type.

The term "MOS" as used herein has been formerly used for laminated metal-oxide-semiconductor structures.

However, in particular, field-effect transistors having an MOS structure (hereinafter, also simply referred to as an "MOS transistor") have obtained improvements in the materials for their gate insulating film and gate electrode from the viewpoint of recent integration and improvements in manufacturing processes.

For example, MOS transistors have adopted polycrystalline silicon, instead of metal, as the material for their gate electrode from the viewpoint of forming, mainly, self-aligned source and drain.

Moreover, from the viewpoint of improving electrical characteristics, the MOS transistors also have adopted a material that has a high dielectric constant as the material for their gate insulating film, but this material is not limited to an oxide.

Thus, the term "MOS" is not limitedly used for laminated structures of metal, oxide, and semiconductor, and the specification of the present invention is not predicated on such a limitations.

Specifically, in view of technical common sense, the term "MOS" as used herein refers to not only an abbreviation derived from its etymology, but also have meaning that widely includes even laminated structures of conductor, insulator, and semiconductor.

In the following description, a phrase "constituent elements A and B are electrically connected to each other" means that a current flows in both directions between the constituent elements A and B.

Configuration of Silicon Carbide Semiconductor Device

A semiconductor device according to the present embodiment is a silicon carbide semiconductor device that serves as an SiC-MOSFET using a substrate made of silicon carbide (SiC) as a base material. FIG. 1 is a plan view schematically showing an example of a configuration of the SiC-MOSFET according to the present embodiment.

As illustrated by way of example in FIG. 1, the SiC-MOSFET is formed on the upper surface of a silicon carbide epitaxial substrate 30 in plan view and includes a gate line electrode 2 and a source electrode 3 in the central portion, the gate line electrode serving as a pad to which a gate voltage is applied from an external control circuit (not shown in FIG. 1), and the source electrode serving also as a pad.

Note that a surface protection film 4 is provided at the edge in plan view of the silicon carbide epitaxial substrate 30 illustrated by way of example in FIG. 1. In FIG. 1, the position of the internal edge of the surface protection film 4, i.e., the contour of the surface protection film 4, is indicated by broken lines.

FIG. 2 is a sectional view schematically showing an example of a configuration of a peripheral portion of the SiC-MOSFET 100 according to the present embodiment. FIG. 2 corresponds to a section taken along line a-a' in FIG. 1.

As illustrated by way of example in FIG. 2, the SiC-MOSFET 100 is configured using the silicon carbide epitaxial substrate 30. The silicon carbide epitaxial substrate 30 includes a silicon carbide monocrystalline substrate 31 and an epitaxial growth layer 34 that is formed on the upper surface of the silicon carbide monocrystalline substrate 31.

The silicon carbide monocrystalline substrate 31 is a semiconductor substrate of silicon carbide of the n type (first conductivity type). The epitaxial growth layer 34 is a semiconductor layer of silicon carbide formed by epitaxial growth on the upper surface of the silicon carbide monocrystalline substrate 31. The present embodiment uses the silicon carbide epitaxial substrate 30 of the 4H polytype. The epitaxial growth layer 34 includes buffer layer 32 and a drift layer 33 that is formed on the upper surface of the buffer layer 32 and has a lower impurity concentration than the buffer layer 32.

The buffer layer 32 is formed in a surface on a first direction side of the thickness direction of the silicon carbide monocrystalline substrate 31 (i.e., on the upper surface). The buffer layer 32 causes recombination of holes injected from the device's upper surface side and reduces the density of holes that reach the silicon carbide monocrystalline substrate 31. The buffer layer 32 may also have a function of converting basal plane dislocations in the silicon carbide monocrystalline substrate 31 into edge dislocations. Moreover, the buffer layer 32 may be formed of an lamination of a plurality of layers. A higher impurity concentration of the buffer layer 32 enhances the ability to suppress the extension of stacking faults when a current passing through the body diode increases. Thus, the impurity concentration and thickness of the buffer layer 32 are set according to the current density of the current passing through the body diode of the semiconductor device. For example, the impurity concentration of the buffer layer 32 may be higher than or equal to $1\times10^{18}$ $cm^{-3}$ and lower than or equal to $2\times10^{19}$ $cm^{-3}$.

The drift layer 33 is formed on the first direction side of the thickness direction of the buffer layer 32 (i.e., on the upper surface). The impurity concentration of the drift layer 33 is lower than the impurity concentration of the silicon carbide monocrystalline substrate 31 and the impurity concentration of the buffer layer 32. The impurity concentration and thickness of the drift layer 33 is determined according to the breakdown voltage of the semiconductor device. For example, the impurity concentration of the drift layer 33 may be higher than or equal to $1\times10^{14}$ $cm^{-3}$ and lower than or equal to $1\times10^{17}$ $cm^{-3}$. Moreover, the thickness of the drift layer 33 may, for example, be greater than or equal to 5 μm and less than or equal to several hundred nanometers. As illustrated by way of example in FIG. 2, the SiC-MOSFET 100 has assigned thereto an active region 5 in which a device structure such as a field-effect transistor is formed, and a termination region 6 that surrounds the active region 5.

In a surface layer on the upper surface side of the epitaxial growth layer 34 in the active region 5, i.e., in a surface layer on the upper surface side of the drift layer 33, p well regions 10 that are well regions of the p type (second conductivity type) are selectively formed. Also, in the surface layer of the p well region 10, a source region 11 of the n type (first conductivity type) and a p-type contact region 12 that has a higher impurity concentration than the p well region 10 are selectively formed. Note that the p-type contact region 12 is formed to be surrounded by the p well region 10 in plan view.

On the upper surface of the silicon carbide epitaxial substrate 30 in the active region 5, a gate insulating film 13 is formed so as to cover portions of the p well regions 10 that are each sandwiched between the n-type source region 11 and the drift layer 33. A gate electrode 14 is further formed on the upper surface of the gate insulating film 13.

Surface-layer portions of the p well regions 10 that are covered with the gate insulating film 13 and the gate electrode 14, i.e., portions of the p well regions 10 that are sandwiched between the n-type source regions 11 and the drift layers 33, serve as channel regions in which an inversion channel is formed in the ON state of the SiC-MOSFET 100.

In the active region 5, the gate electrode 14 is covered with an interlayer insulation film 15. The interlayer insulation film 15 has a source electrode 3 formed on its upper surface. Thus, the interlayer insulation film 15 provides electrical insulation between the gage insulating film 13 and the gate electrode 15.

The source electrode 3 is connected to the n-type source regions 11 and the p-type contact regions 12 via contact holes formed in the interlayer insulation film 15. The source electrode 3 and the p-type contact regions 12 establish ohmic contact.

The termination region 6 surrounds the active region 5 in plan view. In a surface layer on the upper surface side of the epitaxial growth layer 34 in the termination region 6, i.e., in a surface layer of the drift layer 33, p-type terminal well regions 16 are selectively formed so as to surround the active region 5.

In a surface layer of each p-type terminal well region 16, a p-type high-concentration terminal well region 17 having a higher impurity concentration than the p-type terminal well region 16 is formed. On outer peripheral portions of the p-type terminal well regions 16, a p-type extended terminal well region 18 is formed to retain the breakdown voltage of the SiC-MOSFET 100.

The p-type extended terminal well region 18 serves as a junction termination extension (JTE) region of the second conductivity type. The structure of the p-type extended terminal well region 18 may, for example, be a field limiting ring (i.e., FLR) structure formed in a ring shape along the outer periphery of the SiC-MOSFET 100. In plan view of the SiC-MOSFET 100, the innermost portion of the p-type extended terminal well region 18 is connected to the outermost peripheral portion of at least one of the p-type terminal well region 16 and the high-concentration terminal well region 17.

As illustrated by way of example in FIG. 2, part of the gate insulating film 13, part of the gate electrode 14, part of the interlayer insulation film 15, and part of the source electrode 3 extend from the active region 5 to the termination region 6 across the boundary between the active region 5 and the termination region 6.

The source electrode 3 drawn to the termination region 6 is connected via the contact holes formed in the interlayer insulation film 15 to the high-concentration terminal well regions 17 formed in the p-type terminal well regions 16 so as to establish ohmic contact. The gate electrode 14 drawn to the termination region 6 is connected via the gate insulating film 13 to either or both of the p-type terminal well regions 16 and the p-type high-concentration terminal well regions 17.

Moreover, a field insulation film 19, the gate line electrode 2, and the surface protection film 4 are provided on the upper surface of the silicon carbide epitaxial substrate 30 in the termination region 6.

The field insulation film 19 covers part of the p-type terminal well regions 16 and the whole of the p-type extended terminal well region 18 and extends to the outside of the p-type terminal well regions 16 across the outer peripheral edges of the p-type terminal well regions 16. The field insulation film 19 is not provided in the active region 5. In other words, the field insulation film 19 has an opening that includes the active region 5.

The gate line electrode 2 is formed on the upper surface of the interlayer insulation film 15 that covers the gate electrode 14 drawn to the termination region 6, and is connected via the contact holes formed in the interlayer insulation film 15 to the gate electrode 14.

The surface protection film 4 is formed to cover a portion of the source electrode 3 that is located close to the termination region 6 in the active region 5, a portion of the source electrode 3 that is located in the termination region 6, the gate line electrode 2, and the field insulation film 19. The surface protection film 4 also covers part of the silicon carbide epitaxial substrate 30 in the termination region 6.

Here, the position of a boundary A between the active region 5 and the termination region 6 according to the present embodiment is a position that corresponds to any of the innermost edges of the p-type terminal well regions 16 and the innermost edge of the p-type high-concentration terminal well region 17 that is closer to the central portion of the active region 5 (that is located more inward).

Meanwhile, a backside electrode 20 is provided on the lower surface (back surface) of the silicon carbide monocrystalline substrate 31. The backside electrode 20 includes backside electrode layers 20*a* and 20*b* and an ohmic contact region 21. The backside electrode layer 20*a* is formed on part of the lower surface of the silicon carbide monocrystalline substrate 31. The ohmic contact region 21 is formed in the portion of the lower surface of the silicon carbide monocrystalline substrate 31 on which the backside electrode layer 20*a* is not formed. The backside electrode layer 20*b* is formed across the lower surfaces of the backside electrode layer 20*a* and the ohmic contact region 21.

As illustrated by way of example in FIG. 2, the ohmic contact region 21 is formed so as to be sandwiched between the lower surface of the silicon carbide monocrystalline substrate 31 and the upper surface of the backside electrode layer 20*b*. In the present embodiment, the ohmic contact region 21 is a silicide region of the metal used for the backside electrode layer 20*a*.

The formation of the ohmic contact region 21 allows the backside electrode 20 and the silicon carbide monocrystalline substrate 31 to have ohmic contact in the region in which the ohmic contact region 21 is formed, and this results in a passage of current at low resistance between the backside electrode 20 and the silicon carbide monocrystalline substrate 31.

On the contrary, in the region in which the ohmic contact region 21 is not formed (i.e., the region in which the backside electrode layer 20*a* is formed), the contact resistance between the backside electrode 20 and the silicon carbide monocrystalline substrate 31 becomes high, and accordingly electric resistivity increases. This restricts the flow of current between the backside electrode 20 and the silicon carbide monocrystalline substrate 31.

Therefore, according to the present embodiment, the region in which the ohmic contact region 21 is formed in plan view is assumed as a low-resistance region 7 that has low electric resistivity (contact resistivity) between the silicon carbide monocrystalline substrate 31 and the backside electrode 20, and the region in which the ohmic contact region 21 is not formed in plan view is assumed as a high-resistance region 8 that has high electric resistivity (contact resistivity) between the silicon carbide monocrystalline substrate 31 and the backside electrode 20.

When a current is passed through the SiC-MOSFET 100, the backside electrode 20 has different current densities between in the low-resistance region 7 and in the high-resistance region 8. Specifically, almost no current flows in the high-resistance region 8, whereas a current with a high current density flows in the low-resistance region 7.

In the present embodiment, the high-resistance region 8 is provided astraddle the active region 5 and the termination region 6 and across the boundary A between the active region 5 and the termination region 6.

In order to explain the configuration described above, one example of a configuration of a silicon carbide semiconductor device known by the inventors will be described first. FIG. 14 is a sectional view schematically showing one example of a configuration of an SiC-MOSFET 400 known by the inventors.

As illustrated by way of example in FIG. 14, the SiC-MOSFET 400 is configured using a silicon carbide epitaxial substrate 30. The silicon carbide epitaxial substrate 30 includes a silicon carbide monocrystalline substrate 31 and an epitaxial growth layer 34. The epitaxial growth layer 34 includes a buffer layer 32 and a drift layer 33. As illustrated by way of example in FIG. 14, the SiC-MOSFET 400 has assigned thereto an active region 5 in which a device structure is formed, and a termination region 6 that surrounds the active region 5.

In a surface layer on the upper surface side of the epitaxial growth layer 34 in the active region 5, p well regions 10 are selectively formed. In a surface layer of each p well region 10, an n-type source region 11 and a p-type contact region 12 are each selectively formed.

On the upper surface of the silicon carbide epitaxial substrate 30 in the active region 5, a gate insulating film 13 is formed. Moreover, a gate electrode 14 is formed on the upper surface of the gate insulating film 13.

In the active region 5, the gate electrode 14 is covered with an interlayer insulation film 15. Moreover, a source electrode 3 is formed on the upper surface of the interlayer insulation film 15.

In the surface layer on the upper surface side of the epitaxial growth layer 34 in the termination region 6, p-type terminal well regions 16 are selectively formed so as to surround the active region 5. In the surface layer of each p-type terminal well region 16, a p-type high-concentration terminal well region 17 is formed. Moreover, a p-type extended terminal well region 18 is formed on the outer peripheral portion of the p-type terminal well region 16.

Furthermore, a field insulation film 19, a gate line electrode 2, and a surface protection film 4 are provided on the upper surface of the silicon carbide epitaxial substrate 30 in the termination region 6.

Here, the position of a boundary A between the active region 5 and the termination region 6 in FIG. 14 is a position that corresponds to any of the innermost edges of the p-type terminal well regions 16 and the innermost edge of the p-type high-concentration terminal well region 17 that is closer to the central portion of the active region 5 (that is located more inward).

Meanwhile, an ohmic contact region 221 is formed on the lower surface (back surface) of the silicon carbide epitaxial substrate 30. Moreover, a backside electrode layer 220 is formed on the lower surface of the ohmic contact region 221.

Researches conducted by the inventors have shown that, in the case where a current is passed through a body diode of the SiC-MOSFET 400 having the structure as illustrated in FIG. 14, if a large current is applied to the central portion of the active region 5, the epitaxial growth layer 34 have regions in which the current density for holes increases, in the vicinity of the boundary A between the termination region 6 and the active region 5. Specifically, there is a region whose current density for holes is twice or more of the current density for holes in the central portion of the active region 5.

It has been also found that this phenomenon becomes more noticeable as the current density of the current applied to the central portion of the active region 5 increases, and that a relatively larger current concentrates in the vicinity of the boundary A between the termination region 6 and the active region 5 than in the central portion of the active region 5. This has led to the first discovery that stacking faults occur preferentially in regions in the vicinity of the boundary A between the termination region 6 and the active region 5 and cause fluctuations in device characteristics (so-called device deterioration).

For example, in the case where a current with a current density of 500 A/cm$^2$ is passed through the body diode in the central portion of the active region 5, a hole current with a current density higher than or equal to 1000 A/cm$^2$ flows through the epitaxial growth layer 34 in the vicinity of the boundary A between the active region 5 and the termination region 6.

In the case where a large current flows even in part of the vicinity of the epitaxial growth layer 34 in plan view, the buffer layer 32 needs to be designed so as to become suitable for the maximum current. Thus, even in the case where a current with a current density of 500 A/cm$^2$ is passed through the body diode on average, the necessity to introduce the buffer layer 32 that is suitable for a current with a current density of 1000 A/cm$^2$ arises in order to suppress deterioration in device characteristics.

Ordinarily, as the current density of the current flowing through the body diode increases, the buffer layer 32 that is necessary to prevent deterioration in characteristics also needs to increase in thickness. This is undesirable from the viewpoint of productivity.

In order to identify the cause of the current concentration described above, the inventors have conducted analysis and evaluations using a current simulation. As a result, they have found that one of the causes of the current concentration described above is that the current circles around from the termination region 6 to the edge of the active region 5 due to a geometric relationship between the source electrode 3 and the backside electrode layer 220.

In the SiC-MOSFET 400, the backside electrode layer 220 and the source electrode 3 in the termination region 6 in the vicinity of the boundary A are connected through the p-type terminal well region 16 and the p-type high-concentration terminal well region 17. This structure is provided in order to improve the breakdown resistance of the SiC-MOSFET 400 and designed to make the contact resistivity in this region per unit area lower than the contact resistivity in the active region 5 per unit area.

This makes the electric resistivity of a route passing through the active region 5 higher than the electric resistivity of a route passing through the p-type terminal well region 16 and the p-type high-concentration terminal well region 17, and causes a phenomenon in which the current flows also from the backside electrode layer 220 that opposes the active region 5 into the termination region 6.

Accordingly, a large current flows locally in the vicinity of the boundary A between the active region 5 and the termination region 6. The inventors have also found out that this large current also causes a further current concentration.

To reduce the occurrence of such a phenomenon, the contact resistivity in the termination region 6 may be increased, but this increase lowers the breakdown resistance. It is thus necessary to achieve both an improvement in breakdown resistance and a reduction in current concentration and thereby to suppress deterioration in device characteristics.

In PN diodes described in, for example, Japanese Patent Application Laid-Open No. 9-36388, a termination structure for improving the breakdown resistance is not formed, and additionally a p-type impurity layer is formed in the entire surface layer of a drift layer in the active region. Thus, resistivity in the termination region per unit area does not become lower than resistivity in the active region per unit area. That is, the current concentration caused by a reduction in contact resistivity in the termination region cannot occur in the PN diodes as described in, for example, Japanese Patent Application Laid-Open No. 9-36388.

From the above, it becomes obvious that the structure of the termination region 6 according to the present embodiment is the structure specific to MOSFETs and that the current concentration caused by the structure of the termination region 6 as illustrated in the present embodiment during the passage of current through the body diode is the issue specific to MOSFETs.

In order to efficiently manufacture a high-reliability SiC-MOSFET with suppressed device deterioration, it is important to avoid the current concentration occurring in the vicinity of the boundary between the active region and the termination region during the passage of current through the body diode without lowering the breakdown resistance of the SiC-MOSFET.

In the SiC-MOSFET 100 according to the present embodiment, as described above, the high-resistance region 8 is provided astraddle the active region 5 and the termination region 6 and across the boundary A between the active region 5 and the termination region 6. This configuration reduces the possibility that the current circles around from the termination region 6 to the edge of the active region 5, and thereby suppresses the concentration of the current density for holes in the vicinity of the boundary A between the termination region 6 and the active region 5.

This effectively suppresses the extension of stacking faults in the vicinity of the boundary A between the termination region 6 and the active region 5 without increasing the thickness of the buffer layer 32. That is, it is possible to manufacture a high-reliability SiC-MOSFET without impairing productivity.

A distance Di in plan view between the boundary A and an inner boundary Bi of the high-resistance region 8 that corresponds to the boundary between the ohmic contact region 21 and the backside electrode layer 20*a* (the boundary of the high-resistance region 8 in the active region 5) is set according to the thickness of the silicon carbide epitaxial substrate 30. For example, when the silicon carbide epitaxial substrate 30 has a thickness (i.e., a total thickness of the silicon carbide monocrystalline substrate 31 and the epitaxial growth layer 34) of T [μm], the distance Di is set to be greater than or equal to T×1.0 [μm] and less than or equal to T×10.0 [μm].

This is because, if the distance Di is less than or equal to T×1.0 [μm], it is difficult to sufficiency achieve the effect of the present embodiment. Moreover, if the distance Di is greater than or equal to T×10.0 [μm], the area of the low-resistance region 7 becomes too small with respect to the device area of the SiC-MOSFET 100. This increases electrical resistance during the passage of current. For example, when the silicon carbide epitaxial substrate 30 has a thickness of 100 μm, the distance Di is set to be greater than or equal to 100 μm and less than or equal to 1000 μm.

Meanwhile, a distance Do in plan view between the boundary A and an outer boundary Bo of the high-resistance region 8 (the boundary of the high-resistance region 8 in the termination region 6) is also set according to the thickness of the silicon carbide epitaxial substrate 30. When the silicon carbide epitaxial substrate 30 has a thickness of T [μm], the distance Do is set to be greater than or equal to T×1.0 [μm].

This is because, if the distance Do is less than or equal to T×1.0 [μm], it is difficult to sufficiently achieve the effect of the present embodiment. The distance Do may be greater than or equal to T×1.0 [μm], and the boundary Bo may be located at the outermost periphery of the SiC-MOSFET 100. In other words, the entire region outside the boundary A between the active region 5 and the termination region 6 may be the high-resistance region 8.

Forming an ohmic contact region, i.e., silicide, may improve the adhesion of the silicon carbide monocrystalline substrate 31 and the backside electrode 20. In that case, exfoliation of the backside electrode 20 from the end portion of the device can be suppressed by forming the low-resistance region 7 on the outer peripheral edge of the termination region 6 as illustrated by way of example in FIG. 2.

On the contrary, forming an ohmic contact region, i.e., silicide, may deteriorate the adhesion of the silicon carbide monocrystalline substrate 31 and the backside electrode 20. In that case, the exfoliation of the backside electrode 20 from the end portion of the device can be suppressed by not forming the low-resistance region 7 on the outer peripheral edge of the termination region 6 (i.e., by forming the high-resistance region 8 across the entire termination region 6).

Note that the reason why the lower limit value for the distances Di and Do is set to T×1.0 is because the current starts to circulate around with an angle of approximately 45°.

The structure according to the present embodiment suppresses an increase in current density that may be caused in the vicinity of the boundary A between the active region 5 and the termination region 6, and allows the current to flow uniformly in the active region 5. Accordingly, it is possible to manufacture the high-reliability SiC-MOSFET 100 with suppressed device deterioration while reducing the possibility that productivity is impaired due to an increase in the thickness of the buffer layer 32.

Method of Manufacturing Silicon Carbide Semiconductor Device

Next, a method of manufacturing the SiC-MOSFET 100, which is the silicon carbide semiconductor device according to the present embodiment, will be described with reference to FIGS. 1 to 3.

First, the low-resistance silicon carbide monocrystalline substrate 31 that contains a relatively high concentration (n+) of n-type impurities is prepared. In the present embodiment, the silicon carbide monocrystalline substrate 31 is assumed to be an SiC substrate of the 4H polytype that has an off angle greater than or equal to 2° and less than or equal to 8°.

Next, the buffer layer 32 having, for example, an n-type impurity concentration higher than or equal to $1\times10^{18}$ $cm^{-3}$ and lower than or equal to $2\times10^{19}$ $cm^{-3}$ is formed by epitaxial growth on the upper surface of the silicon carbide monocrystalline substrate 31 by chemical vapor deposition (i.e., CVD). For example, the buffer layer 32 may have a thickness greater than or equal to 0.5 μm and less than or equal to 10 μm.

Next, the drift layer 33 having, for example, an n-type impurity concentration higher than or equal to $1\times10^{14}$ $cm^{-3}$ and lower than or equal to $1\times10^{17}$ $cm^{-3}$ is formed by epitaxial growth on the upper surface of the buffer layer 32. For example, the drift layer 33 may have a thickness greater than or equal to 5 μm and less than or equal to several hundred micrometers. In this way, the silicon carbide epitaxial substrate 30 is obtained.

Next, an impurity region is formed in the surface layer of the drift layer 33 by repeating a photolithography process of forming a resist mask and an ion implantation process using the resist mask as an implantation mask. Specifically, the p-type terminal well region 16, the p well region 10, the p-type contact region 12, and the n-type source region 11 are formed in the surface layer of the drift layer 33.

In the ion implantation process described above, nitrogen (N) is used as n-type impurities, and Al or B is used as p-type impurities.

In the ion implantation process described above, the p well region 10 and the p-type terminal well region 16 may be formed collectively by one ion implantation process. Also, the p-type contact region 12 and the p-type high-concentration terminal well region 17 may be formed collectively by one ion implantation process.

For example, the p well region 10 and the p-type terminal well region 16 may have impurity concentrations higher than or equal to $1.0\times10^{18}/cm^3$ and lower than or equal to $1.0\times10^{20}/cm^3$. The impurity concentration of the n-type source region 11 is in ranges higher than the impurity concentration of the p well region 10, and may, for example, be higher than or equal to $1.0\times10^{19}/cm^3$ and lower than or equal to $1.0\times10^{21}/cm^3$. Doses of the p-type contact region 12 and the extended terminal well region 18 may preferably be higher than or equal to $0.5\times10^{13}/cm^2$ and lower than or equal to $5\times10^{13}/cm^2$, and may, for example, be $1.0\times10^{13}/cm^2$.

Implantation energy during ion implantation in the case of using Al as impurities may, for example, be higher than or equal to 100 keV and lower than or equal to 700 keV. In this case, the impurity concentration of the p-type extended terminal well region 18 converted from the dose [$cm^{-2}$] is higher than or equal to $1\times10^{17}/cm^3$ and lower than or equal to $1\times10^{19}/cm^3$. Implantation energy during ion implantation in the case of using N as impurities may, for example, be higher than or equal to 20 keV and lower than or equal to 300 keV.

Thereafter, annealing is conducted at a temperature higher than or equal to 1500° C., using heat treatment equipment. This activates the impurities doped by ion implantation.

Next, for example, an $SiO_2$ film having, for example, a thickness higher than or equal to 0.5 μm and lower than or equal to 2 μm is formed by CVD on the upper surface of the silicon carbide epitaxial substrate 30. The, the $SiO_2$ film is patterned by a photolithography process and an etching process to form the field insulation film 19.

At this time, the field insulation film 19 is patterned so as to cover part of the p-type terminal well region 16 and part of the p-type high-concentration terminal well region 17 and to extend toward the outer periphery side of the p-type terminal well region 16 across the edge of the p-type terminal well region 16.

Then, the upper surface of the drift layer 33 that is not covered with the field insulation film 19 is thermally oxidized to form an $SiO_2$ film that serves as the gate insulating film 13. Then, a poly-crystalline silicon film having conductivity is formed by low pressure CVD on the upper surface of the gate insulating film 13 and is patterned by a photolithography process and an etching process to form the gate electrode 14. At this time, the gate electrode 14 may be formed so as to run over the upper surface of the field insulation film 19.

Thereafter, an $SiO_2$ film that serves as the interlayer insulation film 15 is formed by CVD to cover the gate electrode 14. Then, contact holes that penetrate the gate insulating film 13 and the interlayer insulation film 15 and reach each of the p-type contact regions 12, the n-type source regions 11, and the p-type high-concentration terminal well region 17 are formed by a photolithography process and an etching process. Through this step, the contact holes that penetrate the interlayer insulation film 15 and reach the gate electrode 14 are formed in the termination region 6, and the interlayer insulation film 15 that is formed on the upper surface of the field insulation film 19 and the interlayer insulation film 15 that is formed on the edge portion of the drift layer 33 are each removed.

Next, a layer of the material for the source electrode 3 or the gate line electrode 2 is formed on the upper surface of the silicon carbide epitaxial substrate 30 by a method such as sputtering or vapor deposition. Examples of the material for these surface electrodes (the source electrode 3 and the gate line electrode 2) include metal that contains any one or more of Ti, Ni, Al, Cu, and Au, and an Al alloy such as Al—Si. Note that the portion of the silicon carbide epitaxial substrate 30 that is in contact with the surface electrode may have a silicide film formed in advance by heat treatment.

Next, the surface electrode is separated into the source electrode 3 and the gate line electrode 2 by a photolithography process and an etching process. At this time, using the position of the outer peripheral edge of the p-type terminal well region 16 as a reference, the surface electrode is patterned such that the outer peripheral edge of the surface electrode in corner portions of the termination region 6 in plan view are located inward of the outer peripheral edge of the surface electrode that is located in linear portions of the termination region 6 in plan view (such that the outer peripheral edge of the surface electrode in the corner portions is not located outward of the outer peripheral edge of the surface electrode in the linear portions).

Next, the surface protection film 4 is formed so as to cover the outer peripheral edge of the surface electrode and at least part of the upper surface of the silicon carbide epitaxial substrate 30 in the termination region 6. For example, the surface protection film 4 may be processed into a desired shape by exposure or coating of light-sensitive polyimide.

Next, a layer of the material for the backside electrode layer 20*a* is formed on the lower surface of the silicon carbide epitaxial substrate 30 by a method such as sputtering or vapor deposition. Examples of the material for the backside electrode layer 20*a* include metal that contains any one or more of Ti, Ni, Al, Cu, and Au.

Note that, before the formation of the backside electrode layer 20*a*, the silicon carbide epitaxial substrate 30 may be reduced in thickness in order to lower electric resistivity during operations of the SiC-MOSFET 100. The reduction in thickness is realized by removing the lower surface of the silicon carbide monocrystalline substrate 31 by grinding or polishing or by both of grinding and polishing until the silicon carbide epitaxial substrate 30 has a desired thickness. After the reduction in thickness, the silicon carbide epitaxial substrate 30 may have a thickness of approximately 100 μm, and may have a thickness greater than or equal to 50 μm and less than or equal to 200 μm.

Next, the backside electrode layer 20*a* and the silicon carbide monocrystalline substrate 31 are caused to react with each other to form a silicide layer. The formation of the silicide layer establishes ohmic contact between the backside electrode layer 20*a* and the silicon carbide monocrystalline substrate 31. That is, the region in which the silicide layer is formed becomes the ohmic contact region 21 in FIG. 2.

The method of forming the ohmic contact region 21, i.e., the silicide layer, will be described hereinafter.

The formation of the silicide layer is realized by applying laser light from the lower surface of the backside electrode layer 20*a*. Note that, during the application of the laser light, annealing processing may be conducted while spraying an inert gas such as nitrogen to the surface of application of the laser light.

Then, the ohmic contact region 21 is formed by repeating the application of laser light while slightly shifting the position of application of collected laser beams. By adjusting the range of application of the laser beam, the area where the silicide layer is formed and the area where the silicide layer is not formed are controlled properly. Accordingly, as illustrated by way of example in the present embodiment, the ohmic contact region 21 is formed, using part of the backside electrode layer 20*a*.

FIG. 3 is a plan view showing an example of the region in which the ohmic contact region 21 is formed, according to the present embodiment. The region in which the ohmic contact region 21 is formed is a hatched region and is the same as the region in which the low-resistance region 7 is formed. On the other hand, the region that is not hatched is the region in which the ohmic contact region 21 is not formed, and corresponds to the high-resistance region 8. The boundary A between the active region 5 and the termination region 6 is indicated by the dotted line. In FIG. 3, a region that is inside the dotted line indicating the boundary A is the active region 5, and a region that is outside the dotted line indicating the boundary A is the termination region 6.

Referring to FIG. 2, the high-resistance region 8 in which the ohmic contact region 21 is not formed is formed in the range across the boundary A between the active region 5 and the termination region 6. In FIG. 3, the ohmic contact region 21 is also formed on the outer peripheral edge of the termination region 6, i.e., on the edge portion of the device, but the ohmic contact region 21 formed on this portion is not an absolute necessity as described above does not necessarily have to be formed on this portion, and a case is also possible in which the ohmic contact region 21 is not formed in the entire termination region 6 (i.e., the termination region 6 as a whole serves as the high-resistance region 8).

After the ohmic contact region 21 is formed by laser annealing, the surface oxide film is removed, and the backside electrode layer 20*b* is further formed. In this way, it is possible to manufacture the SiC-MOSFET 100, which is the silicon carbide semiconductor device illustrated by way of example in FIG. 2.

Note that, before the formation of the backside electrode layer 20*b*, the backside electrode layer 20*a* that is not silicided may be removed by etching or any other method. In that case, the silicon carbide monocrystalline substrate 31 and the backside electrode layer 20*b* in the high-resistance region 8 are directly connected to each other.

In the low-resistance region 7, silicide is formed by laser annealing in order to form the ohmic contact region 21. The region silicided by the laser annealing tends to have large surface asperities or surface roughness. Thus, referring to the surface asperities on the backside electrode 20, the surface roughness of the low-resistance region 7 is greater than the surface roughness of the high-resistance region 8.

Variation 1

Although a planar-type transistor is shown by way of example in FIG. 2, the transistor serving as the silicon carbide semiconductor device according to the present embodiment may be a trench-type transistor.

Although the SiC-MOSFET 100 illustrated by way of example in FIG. 1 has the gate line electrode 2, which serves as a pad, provided in the upper central portion in plan view, the position and shape of the gate line electrode 2 serving as a pad may be arbitrarily changed. For example, as illustrated by way of example in FIG. 4, a gate line electrode 2A serving as a pad may be provided in a corner portion of an SiC-MOSFET 110, or as illustrated by way of example in FIG. 5, a gate line electrode 2B serving as a pad may be provided so as to cross the central portion of an SiC-MOSFET 120. Note that FIGS. 4 and 5 are plan views schematically illustrating variations of the configuration of the SiC-MOSFET according to the present embodiment.

Figure 6:
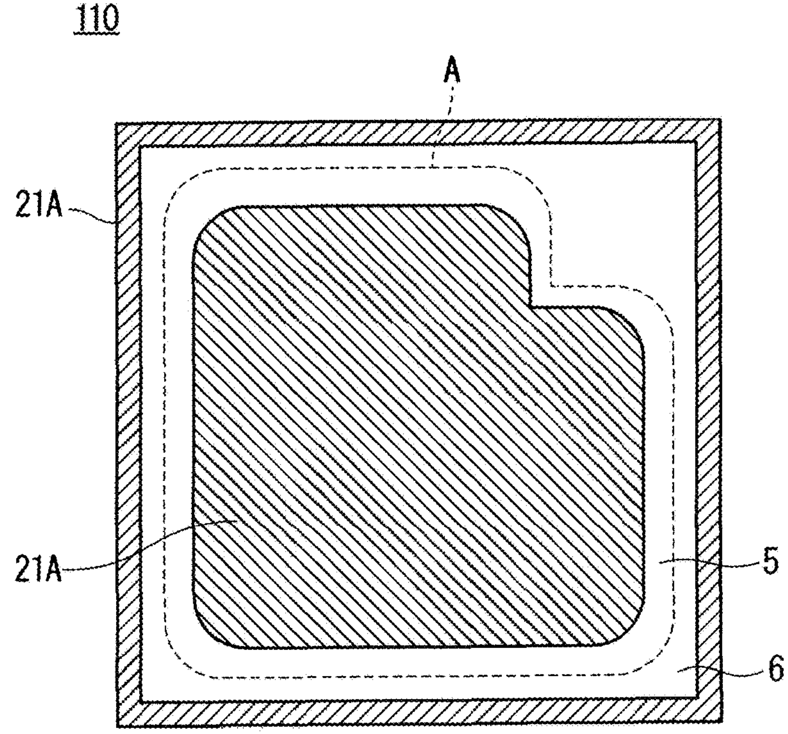
FIG. 6 is a plan view showing an example of the region in which the ohmic contact region is formed in the case where a gate line electrode is provided to serve as a pad for gate lines illustrated by way of example in FIG. 4.

FIG. 6 is a plan view showing an example of a region in which an ohmic contact region 21A is formed in the case of using the gate line electrode 2A serving as a gate line pad illustrated by way of example in FIG. 4. The region in which the ohmic contact region 21A is formed is a hatched region and is the same as the region in which the low-resistance region 7 is formed. On the other hand, the region that is not hatched is a region in which the ohmic contact region 21A is not formed, and corresponds to the high-resistance region 8. The boundary A between the active region 5 and the termination region 6 is indicated by the dotted line. In FIG. 6, the region that is inside the dotted line indicating the boundary A is the active region 5, and the region that is outside the dotted line indicating the boundary A is the termination region 6.

Figure 5:
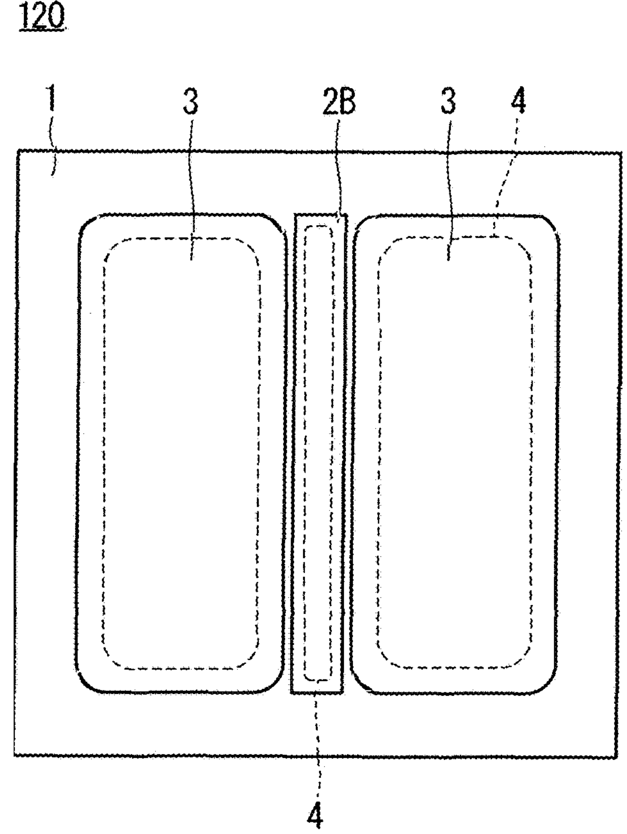
FIG. 5 is a plan view schematically illustrating another variation of the configuration of the SiC-MOSFET according to the embodiment.
Figure 7:
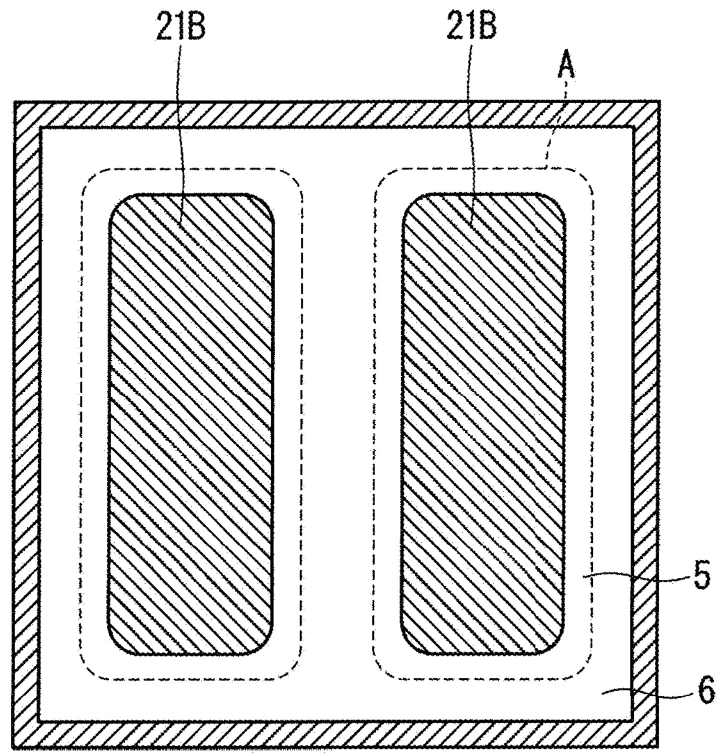
FIG. 7 is a plan view showing an example of the region in which the ohmic contact region is formed in the case where a gate line electrode is provided to serve as a pad for gate lines illustrated by way of example in FIG. 5.

FIG. 7 is a plan view showing an example of a region in which the ohmic contact region 21B is formed in the case of using the gate line electrode 2B serving as a gate line pad illustrated by way of example in FIG. 5. The region in which the ohmic contact region 21B is formed is a hatched region and is the same as the region in which the low-resistance region 7 is formed. On the other hand, a region that is not hatched is the region in which the ohmic contact region 21B is not formed, and corresponds to the high-resistance region 8. The boundary A between the active region 5 and the termination region 6 is indicated by the dotted line. In FIG. 7, the region that is inside the dotted line indicating the boundary A is the active region 5, and the region that is outside the dotted line indicating the boundary A is the termination region 6.

Note that although the ohmic contact region 21A or the ohmic contact region 21B is also formed on the outer peripheral edge of the termination region 6, i.e., the end portion of the device, in FIGS. 6 and 7, the ohmic contact region 21A or the ohmic contact region 21B formed on this portion is not an absolute necessity as described above, and a case is also possible in which the ohmic contact region 21A or the ohmic contact region 21B is not formed in the entire termination region 6 (i.e., the termination region 6 as a whole serves as the high-resistance region 8).

These structure simplify the shape of the region in which the ohmic contact region is formed, as compared with the structure illustrated by way of example in FIG. 3, and facilitates the manufacture of high-reliability devices.

Variation 2

In the examples illustrated in FIGS. 1 to 7, the ohmic contact region is provided in the entire low-resistance region 7. However, the ohmic contact region does not necessarily have to be formed in the entire low-resistance region 7 because the important point is that average electrical resistivity in the range of the high-resistance region 8 from the silicon carbide monocrystalline substrate 31 to the backside electrode 20 is higher than average electrical resistivity in the low-resistance region 7.

FIG. 8 is a sectional view schematically illustrating a variation of the configuration of the peripheral portion of the SiC-MOSFET according to the present embodiment. As illustrated by way of example in FIG. 8, an SiC-MOSFET 101 is configured using the silicon carbide epitaxial substrate 30. The silicon carbide epitaxial substrate 30 includes the silicon carbide monocrystalline substrate 31 and the epitaxial growth layer 34 formed on the upper surface of the silicon carbide monocrystalline substrate 31.

In the surface layer on the upper surface side of the drift layer 33 in the active region 5, the p well regions 10 are selectively formed. In the surface layer of each p well region 10, the n-type source region 11 and the p-type contact region 12 having a higher impurity concentration than the p well region 10 are each selectively formed.

On the upper surface of the silicon carbide epitaxial substrate 30 in the active region 5, the gate insulating film 13 is formed so as to cover the portions of the p well regions 10 that are sandwiched between the n-type source regions 11 and the drift layer 33. Also, the gate electrode 14 is formed on the upper surface of the gate insulating film 13.

In the active region 5, the gate electrode 14 is covered with the interlayer insulation film 15. Also, the source electrode 3 is formed on the upper surface of the interlayer insulation film 15.

The termination region 6 surrounds the active region 5 in plan view. In the surface layer on the upper surface side of the epitaxial growth layer 34, i.e., the surface layer of the drift layer 33, in the termination region 6, the p-type terminal well regions 16 are selectively formed so as to surround the active region 5.

In the surface layer of each p-type terminal well region 16, the p-type high-concentration terminal well region 17 having a higher impurity concentration than the p-type terminal well region 16 is formed. On the outer peripheral portion of the p-type terminal well region 16, the p-type extended terminal well region 18 is formed to retain the breakdown voltage of the silicon carbide semiconductor device.

Moreover, the field insulation film 19, the gate line electrode 2, and the surface protection film 4 are provided on the upper surface of the silicon carbide epitaxial substrate 30 in the termination region 6.

Meanwhile, a backside electrode 520 is formed on the lower surface of the silicon carbide epitaxial substrate 30. The backside electrode 520 includes the backside electrode layers 20*a* and 20*b*, an ohmic contact region 21C, and a non-ohmic contact region 22. The backside electrode layer 20*a* is formed on part of lower surface of the silicon carbide monocrystalline substrate 31. The ohmic contact region 21C and the non-ohmic contact region 22 are formed on the portion of the lower surface of the silicon carbide monocrystalline substrate 31 in which the backside electrode layer 20*a* is not formed. Moreover, the backside electrode layer 20*b* is formed on the lower surface of the backside electrode layer 20*a*, the lower surface of the ohmic contact region 21C, and the lower surface of the non-ohmic contact region 22.

In the structure illustrated by way of example in FIG. 8, the ohmic contact region 21C and the non-ohmic contact region 22 are provided in the low-resistance region 7. This structures shortens the processing time of laser annealing and accordingly achieves effects such as improving productivity.

Alternatively, the electric resistivity may be continuously changed at the boundary between the low-resistance region 7 and the high-resistance region 8 from the silicon carbide monocrystalline substrate 31 to the backside electrode 520 (or the backside electrode 20). In this case, the resistivity per unit area can be changed by continuously changing the interval of application of laser. This enables more precisely controlling uniformity in current density in the epitaxial growth layer 34.

As described above, the SiC-MOSFETs according to the present embodiment can suppress fluctuations in device characteristics without considerably increasing the thickness of the buffer layer 32, even in the case where a forward current with a large current density flows through the body diodes of the field-effect transistors.

Second Embodiment

A silicon carbide semiconductor device according to the present embodiment will be described. In the following description, constituent elements that are similar to those described in the embodiment given above are denoted by the same reference signs, and detailed description thereof shall be omitted as appropriate.

Configuration of Silicon Carbide Semiconductor Device

In the first embodiment, the low-resistance region 7 and the high-resistance region 8 are formed differently by changing electric resistivity according to whether or not the ohmic contact region is formed in the region. Alternatively, it is also possible to form the low-resistance region 7 and the high-resistance region 8 differently by changing the impurity concentration in the lower surface of the silicon carbide monocrystalline substrate 31 to change electric resistivity.

FIG. 9 is a sectional view schematically showing an example of a configuration of a peripheral portion of an SiC-MOSFET 200 according to the present embodiment. FIG. 9 corresponds to the section taken along line a-a' in FIG. 1. Note that the plan view of the SiC-MOSFET 200 according to the present embodiment is the same as that in FIG. 1 according to the first embodiment, and therefore detailed description thereof shall be omitted.

As illustrated by way of example in FIG. 9, the SiC-MOSFET 200 is configured using the silicon carbide epitaxial substrate 30. The silicon carbide epitaxial substrate 30 includes the silicon carbide monocrystalline substrate 31 and the epitaxial growth layer 34 formed on the upper surface of the silicon carbide monocrystalline substrate 31.

In the surface layer on the upper surface side of the drift layer 33 in the active region 5, the p well regions 10 are selectively formed. In the surface layer of each p well region 10, the n-type source region 11 and the p-type contact region 12 having a higher impurity concentration than the p well region 10 are each selectively formed.

On the upper surface of the silicon carbide epitaxial substrate 30 in the active region 5, the gate insulating film 13 is formed so as to cover portions of the p well regions 10 that are sandwiched between the n-type source regions 11 and the drift layers 33. Moreover, the gate electrode 14 is formed on the upper surface of the gate insulating film 13.

In the active region 5, the gate electrode 14 is covered with the interlayer insulation film 15. Moreover, the source electrode 3 is formed on the upper surface of the interlayer insulation film 15.

The termination region 6 surrounds the active region 5 in plan view. In the surface layer on the upper surface side of the epitaxial growth layer 34 in the termination region 6, i.e., in the surface layer of the drift layer 33, the p-type terminal well regions 16 are selectively formed so as to surround the active region 5.

In the surface layer of each p-type terminal well region 16, the p-type high-concentration terminal well region 17 having a higher impurity concentration than the p-type terminal well region 16 is formed. On the outer peripheral portions of the p-type terminal well regions 16, the p-type extended terminal well region 18 is formed so as to retain the breakdown voltage of the silicon carbide semiconductor device.

Moreover, the field insulation film 19, the gate line electrode 2, and the surface protection film 4 are provided on the upper surface of the silicon carbide epitaxial substrate 30 in the termination region 6.

Meanwhile, an ion-implanted region 40 is formed in part of the surface layer on the lower surface side of the silicon carbide epitaxial substrate 30. Moreover, a backside electrode 320 is provided on the lower surface of the silicon carbide epitaxial substrate 30. The backside electrode 320 includes an ohmic contact region 21 that is a silicide region and that is formed on the entire lower surface of the silicon carbide monocrystalline substrate 31, and a backside electrode layer 20*b* that is formed on the entire lower surface of the ohmic contact region 21.

In the region in which the ion-implanted region 40 is provided, electric resistivity increases from the silicon carbide monocrystalline substrate 31 to the backside electrode 320. Thus, this region functions as the high-resistance region 8. Accordingly, a region in which the ion-implanted region 40 is not provided functions as the low-resistance region 7 having a relatively low resistivity, and this causes a difference in current density between the low-resistance region 7 and the high-resistance region 8 in which the ion-implanted region 40 is provided.

That is, according to the present embodiment, the ion-implanted region 40 functioning as the high-resistance region 8 is provided astraddle the active region 5 and the termination region 6 and across the boundary A in the surface layer on the lower surface side of the silicon carbide monocrystalline substrate 31. The range in which the ion-implanted region 40 is formed may, for example, be the same as the range of the high-resistance region 8 in FIG. 2. Note that the ion-implanted region 40 has an impurity concentration different from the impurity concentration in the vicinity of the center of the active region 5 in plan view.

Method of Manufacturing Silicon Carbide Semiconductor Device

Next, a method of manufacturing the SiC-MOSFET 200, which is the silicon carbide semiconductor device according to the present embodiment, will be described with reference to FIG. 9.

First, as in the case of the first embodiment, various components up to the surface protection film 4 are formed in and on the upper surface of the silicon carbide epitaxial substrate 30.

Next, the manufacture of the structure on the lower surface side of the silicon carbide epitaxial substrate 30 will be described. Note that the structure on the lower surface side of the silicon carbide epitaxial substrate 30 may be manufactured after the thickness of the silicon carbide epitaxial substrate 30 is reduced to a desired thickness. The timing of the manufacture of the structure on the lower surface side of the silicon carbide epitaxial substrate 30 may be appropriately selected during the manufacturing process. That is, the structure on the lower surface side of the silicon carbide epitaxial substrate 30 may be manufactured after completion of the manufacture of the structure on the upper surface side of the silicon carbide epitaxial substrate 30, or may be manufactured in the midstream of the manufacture of the structure on the upper surface side of the silicon carbide epitaxial substrate 30.

In the manufacture of the structure on the lower surface side of the silicon carbide epitaxial substrate 30, the ion-implanted region 40 is formed in part of the surface layer on the lower surface side of the silicon carbide monocrystalline substrate 31 by a photolithography process of forming a resist mask on the lower surface of the silicon carbide monocrystalline substrate 31 and an ion implantation process of implanting ions using the resist mask as an implantation mask. At this time, elements that are used in the ion implantation are not particularly limited, and one example of the elements is p-type impurities such as aluminum (Al), boron (B), gallium (Ga), or indium (In). In the case of using impurities of Al, the implantation energy during the ion implantation may, for example, be several hundred kilo-electron-volts, and a maximum value for the impurity concentration converted from the dose [$cm^{-2}$] may, for example, be greater than or equal to $1\times10^{18}/cm^3$.

Thereafter, annealing is conducted at a temperature higher than or equal to 1500° C., using heat treatment equipment. This activates the impurities doped by the ion implantation. This annealing for activating the impurities may be conducted simultaneously with or separately from the activation annealing conducted for the structure on the upper surface side of the silicon carbide epitaxial substrate 30.

The execution of the activation annealing described above reduces the carrier density and significantly raises electric resistivity in the ion-implanted region. Thus, this region functions as the high-resistance region.

The activation annealing of the ion-implanted region 40 in the surface layer on the lower surface side of the silicon carbide epitaxial substrate 30 is not absolutely necessary processing. Thus, this processing may be omitted. Conversely, the activation annealing should not be conducted in the case of using n-type impurities such as nitrogen (N), phosphorus (P), arsenic (As), or antimony (Sb).

The reason why the activation annealing may become unnecessary is because high-density ion implantation may create a large number of implantation defects in monocrystals and cause the ion-implanted region to function as the high-resistance region 8 using the implantation defects as resistance components. The same can be said in the case of implanting either p-type impurities or n-type impurities.

The reason why the activation annealing should not be conducted in the case of ion implantation of n-type impurities is because conducting the activation annealing on the n-type impurities increases the carrier density and lowers the resistance value as well as helping the recovery of implantation defects.

Alternatively, elements that form deep levels, such as vanadium (V) or titanium (Ti), may be used as impurity elements. Using such impurity elements increases the electric resistivity in a region doped with these elements and helps the formation of the high-resistance region 8.

Then, a layer of the material for the backside electrode layer 20*a* is formed on the lower surface of the silicon carbide epitaxial substrate 30 by, for example, sputtering or vapor deposition. Examples of the material for the backside electrode layer 20*a* include metals that contain one or more of Ti, Ni, Al, Cu, and Au.

Then, the backside electrode layer 20*a* and the silicon carbide monocrystalline substrate 31 are caused to react with each other to form a silicide layer. By forming the silicide layer, the ohmic contact region 21 is formed in which the backside electrode layer 20*a* and the silicon carbide monocrystalline substrate 31 establish ohmic contact.

The method of forming silicide may be heat treatment conducted by laser annealing described in the first embodiment, or may be thermal annealing processing using heat treatment equipment. The details of the laser annealing have been described in the first embodiment, and therefore description thereof shall be omitted here. The thermal annealing may be heat treatment conducted at 1000° C. in the case of using, for example, Ni.

Thereafter, the surface oxide film is removed, and the backside electrode layer 20*b* is formed. In this way, the SiC-MOSFET 200, which is the silicon carbide semiconductor device illustrated by way of example in FIG. 9, is manufactured.

The SiC-MOSFET 200 manufactured in this way can suppress an increase in current density that may be caused in the vicinity of the boundary A between the active region 5 and the termination region 6, and allows the passage of a uniform current through the active region 5. This eliminates the need to increase the thickness of the buffer layer 32 and accordingly suppresses impairment of productivity. Besides, it is possible to manufacture a high-reliability silicon carbide semiconductor device.

Note that, although the low-resistance region 7 is formed on the outer peripheral edge of the termination region 6, i.e., on the end portion of the device, in FIG. 9, the low-resistance region 7 formed on this portion is not an absolute necessity, and a case is also possible in which the low-resistance region 7 is not formed in the entire termination region 6 (i.e., the termination region 6 as a whole serves as the high-resistance region 8).

Variation 1

Figure 10:
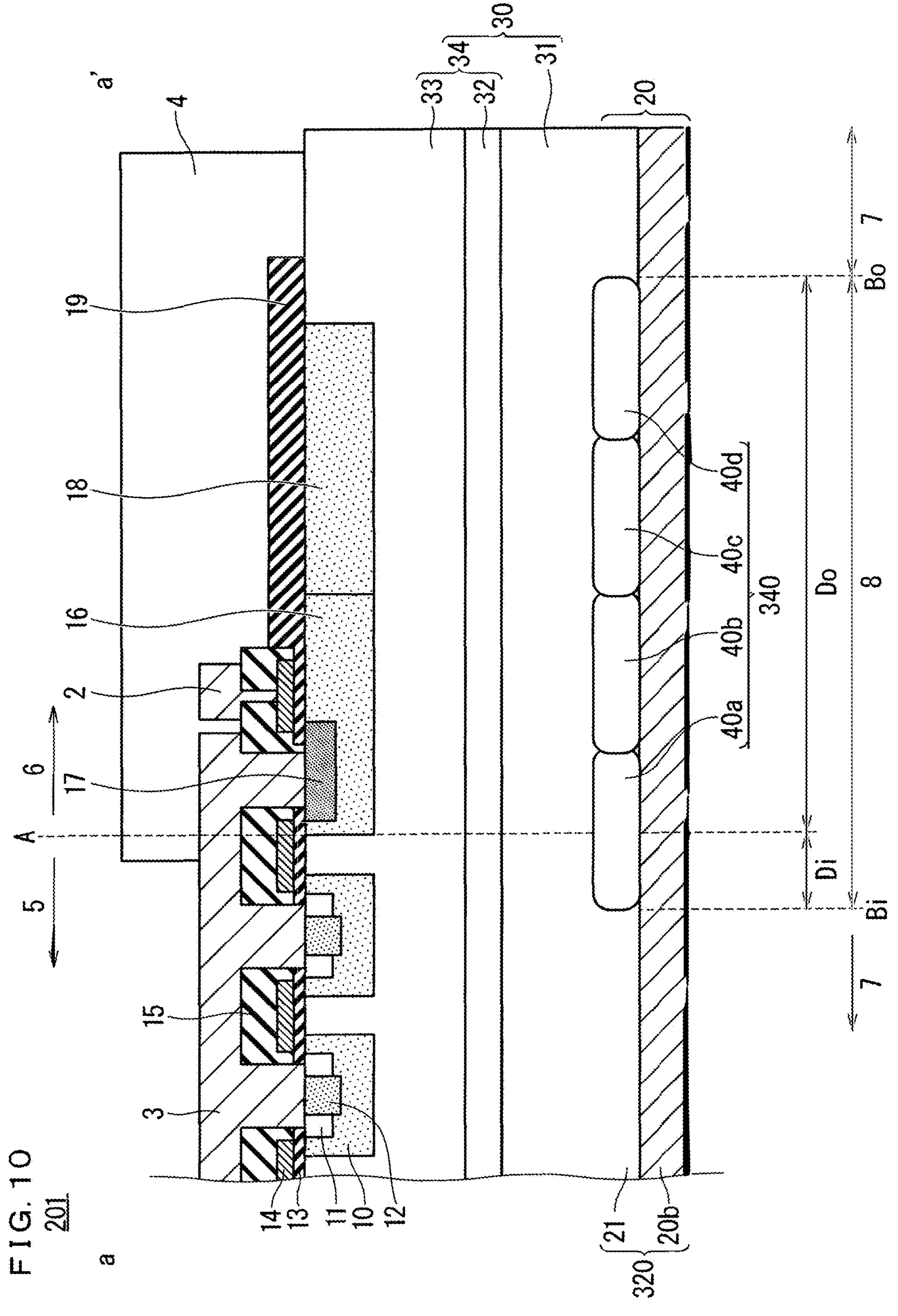
FIG. 10 is a sectional view schematically illustrating a variation of the configuration around the periphery of the SiC-MOSFET according to the embodiment.

The impurity concentration of the ion-implanted region 40 illustrated in FIG. 9 does not necessarily have to be constant, and may vary continuously or in stages. FIG. 10 is a sectional view schematically illustrating a variation of the configuration of the peripheral portion of the SiC-MOSFET according to the present embodiment.

As illustrated by way of example in FIG. 10, an SiC-MOSFET 201 is configured using the silicon carbide epitaxial substrate 30. The silicon carbide epitaxial substrate 30 includes the silicon carbide monocrystalline substrate 31 and the epitaxial growth layer 34 formed on the upper surface of the silicon carbide monocrystalline substrate 31.

In the surface layer on the upper surface side of the drift layer 33 in the active region 5, the p well regions 10 are selectively formed. In the surface layer of each p well region 10, the n-type source region 11 and the p-type contact region 12 having a higher impurity concentration than the p well region 10 are each selectively formed.

On the upper surface of the silicon carbide epitaxial substrate 30 in the active region 5, the gate insulating film 13 is formed so as to cover the portions of the p well regions 10 that are sandwiched between the n-type source regions 11 and the drift layer 33. Moreover, the gate electrode 14 is formed on the upper surface of the gate insulating film 13.

In the active region 5, the gate electrode 14 is covered with the interlayer insulation film 15. Moreover, the source electrode 3 is formed on the upper surface of the interlayer insulation film 15.

The termination region 6 surrounds the active region 5 in plan view. In the surface layer on the upper surface side of the epitaxial growth layer 34 in the termination region 6, i.e., in the surface layer of the drift layer 33, the p-type terminal well regions 16 are selectively formed so as to surround the active region 5.

In the surface layer of each p-type terminal well region 16, the p-type high-concentration terminal well region 17 having a higher impurity concentration than the p-type terminal well region 16 is formed. On the outer peripheral portions of the p-type terminal well regions 16, the p-type extended terminal well region 18 is formed so as to retain the breakdown voltage of the silicon carbide semiconductor device.

Moreover, the field insulation film 19, the gate line electrode 2, and the surface protection film 4 are provided on the upper surface of the silicon carbide epitaxial substrate 30 in the termination region 6.

Meanwhile, an ion-implanted region 340 is formed in part of the surface layer on the lower surface side of the silicon carbide epitaxial substrate 30. Moreover, the backside electrode 320 is provided on the lower surface of the silicon carbide epitaxial substrate 30. The backside electrode 320 includes the ohmic contact region 21 that is a silicide region and formed on the entire lower surface of the silicon carbide monocrystalline substrate 31, and the backside electrode layer 20*b* formed on the entire lower surface of the ohmic contact region 21.

In a region in which the ion-implanted region 340, the electric resistivity increases from the silicon carbide monocrystalline substrate 31 to the backside electrode 320. Thus, this region functions as the high-resistance region 8. Accordingly, a region in which the ion-implanted region 40 is not provided functions as the low-resistance region 7 having a relatively low resistivity, and this causes a difference in current density between the low-resistance region 7 and the high-resistance region 8 in which the ion-implanted region 40 is provided.

The ion-implanted region 340 includes ion-implanted layers 40*a*, 40*b*, 40*c*, and 40*d* each having a different impurity concentration. In FIG. 10, the ion-implanted layers 40*a*, 40*b*, 40*c*, and 40*d* are provided in order from the side closer to the active region 5.

The ion-implanted layers 40*a*, 40*b*, 40*c*, and 40*d* may serve to change the impurity concentration continuously from the side closer to the active region 5, or may serve to change the impurity concentration in stages from the side closer to the active region 5. A mode is also possible in which the impurity concentration becomes highest in the vicinity of the boundary A and decreases as the distance from the boundary A increases. As another alternative, the impurity concentration may be controlled such that electric resistivity varies continuously at the boundary Bo or the boundary Bi between the low-resistance region 7 and the high-resistance region 8.

Note that, although the ion-implanted region 340 is configured of the four ion-implanted layers in the example illustrated in FIG. 10, the number of ion-implanted layers included in the ion-implanted region 340 is not limited to four, and may be two or more.

The configuration illustrated by way of example in FIG. 10 allows more precise control of the current density in the epitaxial growth layer 34.

Note that, although the ohmic contact region 21 is formed on the entire lower surface of the silicon carbide monocrystalline substrate 31 in the structures illustrated by way of example in FIGS. 9 and 10, the range in which the ohmic contact region 21 is formed may be part of the lower surface of the silicon carbide monocrystalline substrate 31.

Third Embodiment

A silicon carbide semiconductor device according to the present embodiment will be described. In the following description, constituent elements that are similar to those described in the embodiments given above are denoted and shown by the same reference signs, and detailed description thereof shall be omitted as appropriate.

Configuration of Silicon Carbide Semiconductor Device

In the first and second embodiments, the low-resistance region 7 and the high-resistance region 8 are formed differently according to the presence or absence of an ohmic contact region and the presence or absence of an ion-implanted region. On the contrary, the low-resistance region 7 and the high-resistance region 8 may be formed differently accordingly to the presence or absence of a backside electrode.

Figure 11:
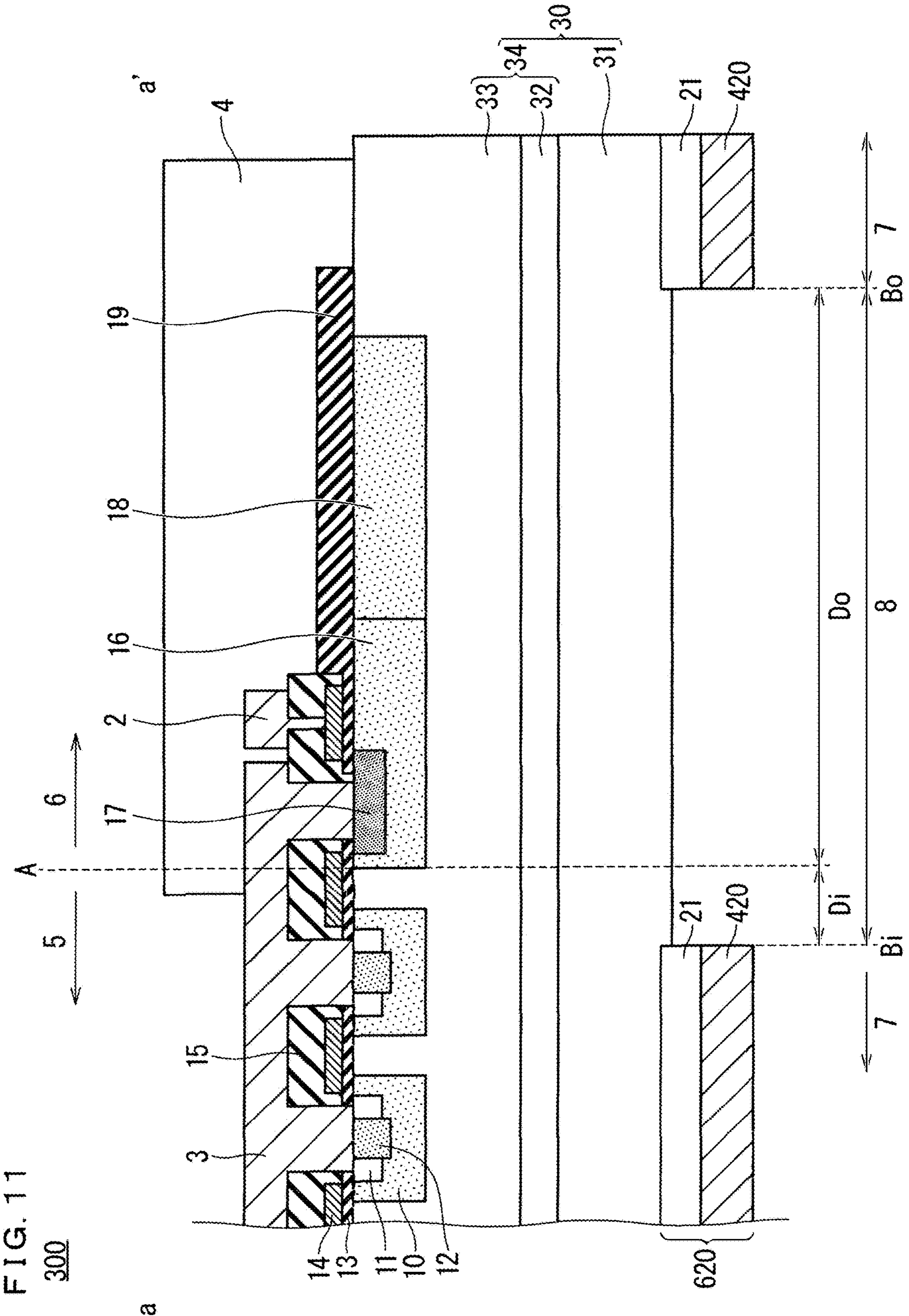
FIG. 11 is a sectional view schematically showing an example of a configuration of the peripheral portion of an SiC-MOSFET according to another embodiment.

FIG. 11 is a sectional view schematically showing an example of a configuration of the peripheral portion of an SiC-MOSFET 300 according to the present embodiment. FIG. 11 corresponds to the section taken along line a-a' in FIG. 1. Note that the plan view of the SiC-MOSFET 300 according to the present embodiment is the same as that in FIG. 1 according to the first embodiment, and therefore detailed description thereof shall be omitted.

As illustrated by way of example in FIG. 11, the SiC-MOSFET 300 is configured using the silicon carbide epitaxial substrate 30. The silicon carbide epitaxial substrate 30 includes the silicon carbide monocrystalline substrate 31 and the epitaxial growth layer 34 formed on the upper surface of the silicon carbide monocrystalline substrate 31.

In the surface layer on the upper surface side of the drift layer 33 in the active region 5, the p well regions 10 are selectively formed. In the surface layer of each p well region 10, the n-type source region 11 and the p-type contact region 12 having a higher impurity concentration than the p well region 10 are each selectively formed.

On the upper surface of the silicon carbide epitaxial substrate 30 in the active region 5, the gate insulating film 13 is formed so as to cover the portions of the p well regions 10 that are sandwiched between the n-type source regions 11 and the drift layer 33. Moreover, the gate electrode 14 is formed on the upper surface of the gate insulating film 13.

In the active region 5, the gate electrode 14 is covered with the interlayer insulation film 15. Moreover, the source electrode 3 is formed on the upper surface of the interlayer insulation film 15.

The termination region 6 surrounds the active region 5 in plan view. In the surface layer on upper surface side of the epitaxial growth layer 34 in the termination region 6, i.e., in the surface layer of the drift layer 33, the p-type terminal well regions 16 are selectively formed so as to surround the active region 5.

In the surface layer of each p-type terminal well region 16, the p-type high-concentration terminal well region 17 having a higher impurity concentration than the p-type terminal well region 16 is formed. On the outer peripheral portions of the p-type terminal well regions 16, the p-type extended terminal well region 18 is formed in order to retain the breakdown voltage of the silicon carbide semiconductor device.

Moreover, the field insulation film 19, the gate line electrode 2, and the surface protection film 4 are provided on the upper surface of the silicon carbide epitaxial substrate 30 in the termination region 6.

Meanwhile, a backside electrode 620 is formed on part of the lower surface of the silicon carbide epitaxial substrate 30. The backside electrode 620 includes the ohmic contact region 21 and a backside electrode layer 420. The ohmic contact region 21 that is a silicide region is formed on part of the lower surface of the silicon carbide epitaxial substrate 30. The backside electrode layer 420 is formed on the lower surface of the ohmic contact region 21.

In the present embodiment, as illustrated by way of example in FIG. 11, the lower surface of the silicon carbide epitaxial substrate 30 has a region in which both of the ohmic contact region 21 and the backside electrode layer 420, i.e., the backside electrode 620, are formed, and a region in which both of the ohmic contact region 21 and the backside electrode layer 420 are not formed.

In this case, the region in which both of the ohmic contact region 21 and the backside electrode layer 420 are not formed functions as the high-resistance region 8. This causes a difference in electric resistivity from the silicon carbide monocrystalline substrate 31 to the backside electrode 620 between the low-resistance region 7 in which both of the ohmic contact region 21 and the backside electrode layer 420 are formed and the high-resistance region 8 in which both of the ohmic contact region 21 and the backside electrode layer 420 are not formed. Specifically, since the high-resistance region 8 restricts the flow of current, the current density in the high-resistance region 8 decrease.

That is, in the structure illustrated in the present embodiment, the high-resistance region 8 is provided astraddle the active region 5 and the termination region 6 and across the boundary A between the active region 5 and the termination region 6. Note that the range of the high-resistance region 8 may, for example, be the same as the range of the high-resistance region 8 in FIG. 2.

As described above, since the region in which both of the ohmic contact region 21 and the backside electrode layer 420 are not formed functions as the high-resistance region 8, it is possible to completely cut off the current path in the high-resistance region 8. Accordingly, the effect of reducing the current density in the high-resistance region 8 becomes more noticeable.

Note that, in the structure illustrated in FIG. 11, the low-resistance region 7 does not necessarily have to be formed on the outer peripheral edge of the termination region 6 (i.e., the high-resistance region 8 may be formed in the entire termination region 6).

Method of Manufacturing Silicon Carbide Semiconductor Device

Next, the method of manufacturing the SiC-MOSFET 300, which is the silicon carbide semiconductor device according to the present embodiment, will be described with reference to FIG. 11.

First, as in the case of the first embodiment, various components up to the surface protection film 4 are formed in and on the upper surface of the silicon carbide epitaxial substrate 30.

Next, the manufacture of the structure on the lower surface side of the silicon carbide epitaxial substrate 30 will be described. Note that the structure on the lower surface side of the silicon carbide epitaxial substrate 30 may be manufactured after the thickness of the silicon carbide epitaxial substrate 30 is reduced to a desired thickness. The timing of the manufacture of the structure on the lower surface side of the silicon carbide epitaxial substrate 30 may be selected appropriately during the manufacturing process. That is, the structure on the lower surface side of the silicon carbide epitaxial substrate 30 may be manufactured after completion of the manufacture of the structure on the upper surface side of the silicon carbide epitaxial substrate 30, or may be manufactured in the midstream of the manufacture of the structure on the upper surface side of the silicon carbide epitaxial substrate 30.

In the manufacture of the structure on the lower surface side of the silicon carbide epitaxial substrate 30, first, a layer of the material for the backside electrode layer 20*a* is formed on the lower surface of the silicon carbide epitaxial substrate 30 by, for example, sputtering or vapor deposition. Examples of the material for the backside electrode layer 20*a* include metals that contain any one or more of Ti, Ni, Al, Cu, and Au.

Then, the backside electrode layer 20*a* and the silicon carbide monocrystalline substrate 31 are caused to react with each other to form a silicide layer. By forming the silicide layer, the ohmic contact region 21 is formed in which the backside electrode layer 20*a* and the silicon carbide monocrystalline substrate 31 establish ohmic contact.

The method of forming silicide may be heat treatment conducted by laser annealing described in the first embodiment, or may be thermal annealing processing using heat treatment equipment. The details of the laser annealing have been described in the first embodiment, and therefore description thereof shall be omitted here. The thermal annealing may be heat treatment conducted at 1000° C. in the case of using, for example, Ni.

Thereafter, the surface oxide film is removed, and the backside electrode layer 420 is formed. Then, a mask is formed on the lower surface of the silicon carbide monocrystalline substrate 31 by, for example, a photolithographic process, and the mask is used to selectively etch the backside electrode layer 420 and the ohmic contact region 21. In this way, the SiC-MOSFET 300, which is the silicon carbide semiconductor device illustrated by way of example in FIG. 11, is manufactured.

Note that, although the low-resistance region 7 and the high-resistance region 8 are formed differently according to the presence or absence of the backside electrode layer 420 and the ohmic contact region 21 in the present embodiment, the low-resistance region 7 and the high-resistance region 8 may be formed differently by forming an electrode layer using a different type of metal in each of the low-resistance region 7 and the high-resistance region 8.

Figure 12:
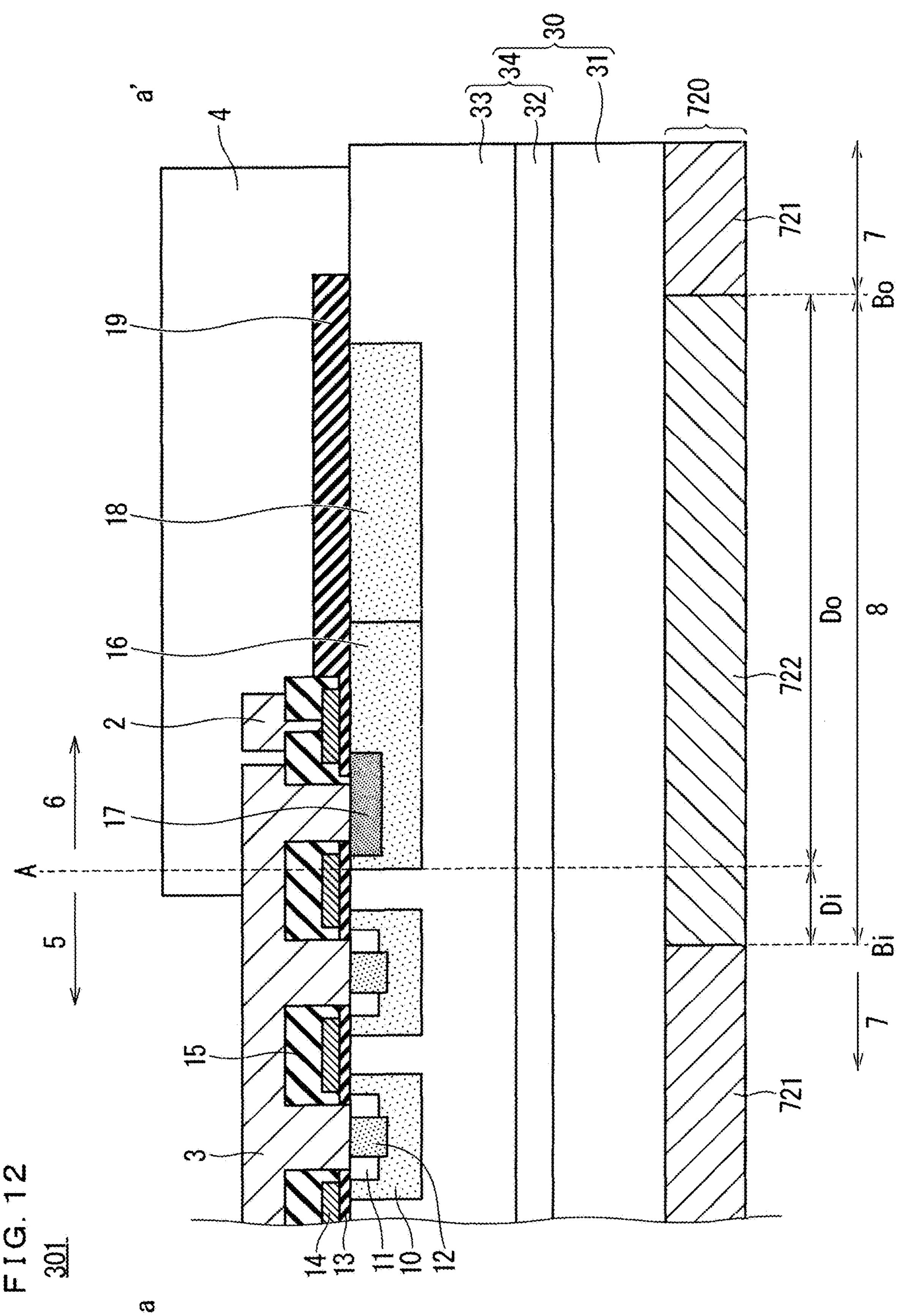
FIG. 12 is a sectional view schematically illustrating a variation of the configuration of the peripheral portion of the SiC-MOSFET according to the embodiment.

FIG. 12 is a sectional view schematically illustrating a variation of the configuration of the peripheral portion of the SiC-MOSFET according to the present embodiment. As illustrated in FIG. 12, an SiC-MOSFET 301 is configured using the silicon carbide epitaxial substrate 30. The silicon carbide epitaxial substrate 30 includes the silicon carbide monocrystalline substrate 31 and the epitaxial growth layer 34 formed on the upper surface of the silicon carbide monocrystalline substrate 31.

In the surface layer on the upper surface side of the drift layer 33 in the active region 5, the p well regions 10 are selectively formed. In the surface layer of each p well region 10, the n-type source region 11 and the p-type contact region 12 having a higher impurity concentration than the p well region 10 are each selectively formed.

On the upper surface of the silicon carbide epitaxial substrate 30 in the active region 5, the gate insulating film 13 is formed so as to cover the portions of the p well regions 10 that are sandwiched between the n-type source regions 11 and the drift layer 33. Moreover, the gate electrode 14 is formed on the upper surface of the gate insulating film 13.

In the active region 5, the gate electrode 14 is covered with the interlayer insulation film 15. Moreover, the source electrode 3 is formed on the upper surface of the interlayer insulation film 15.

The termination region 6 surrounds the active region 5 in plan view. In the surface layer on the upper surface side of the epitaxial growth layer 34 in the termination region 6, i.e., in the surface layer of the drift layer 33, the p-type terminal well regions 16 are selectively formed so as to surround the active region 5.

In the surface layer of each p-type terminal well region 16, the p-type high-concentration terminal well region 17 having a higher impurity concentration than the p-type terminal well region 16 is formed. On the outer peripheral portions of the p-type terminal well regions 16, the p-type extended terminal well region 18 is formed in order to retain the breakdown voltage of the silicon carbide semiconductor device.

Moreover, the field insulation film 19, the gate line electrode 2, and the surface protection film 4 are provided on the upper surface of the silicon carbide epitaxial substrate 30 in the termination region 6.

Meanwhile, a backside electrode 720 is formed on the lower surface of the silicon carbide epitaxial substrate 30. The backside electrode 720 includes a backside electrode layer 721 that is a metal layer, and a backside electrode layer 722 that is a metal layer containing a different type of metal from the metal of the backside electrode layer 721. The backside electrode layer 721 is formed on part of the lower surface of the silicon carbide monocrystalline substrate 31. The backside electrode layer 722 is formed on the portion of the silicon carbide monocrystalline substrate 31 on which the backside electrode layer 721 is not formed.

In the structure illustrated by way of example in FIG. 12, the backside electrode layer 721 is provided in the low-resistance region 7. On the other hand, the backside electrode layer 722 that higher contact resistivity against the silicon carbide monocrystalline substrate 31 than the backside electrode layer 721 is formed in the high-resistance region 8.

As described above, the SiC-MOSFET according to the present embodiment can suppress fluctuations in device characteristics without considerably increasing the thickness of the buffer layer 32, even in the case where a forward current with a large current density flows through the body diode of the field-effect transistor.

Fourth Embodiment

A power converter and a method of manufacturing the power converter according to the present embodiment will be described. In the following description, constituent elements that are similar to those described in the embodiments given above are denoted and shown by the same reference signs, and detailed description thereof shall be omitted as appropriate.

Configuration of Power Converter

The present embodiment is realized by applying the silicon carbide semiconductor device according to any one of the embodiments described above to a power converter. The power converter to which the silicon carbide semiconductor device is applied is not limited to a power converter for particular use, but the following description is given of an example in which the silicon carbide semiconductor device is applied to a three-phase inverter.

Figure 13:
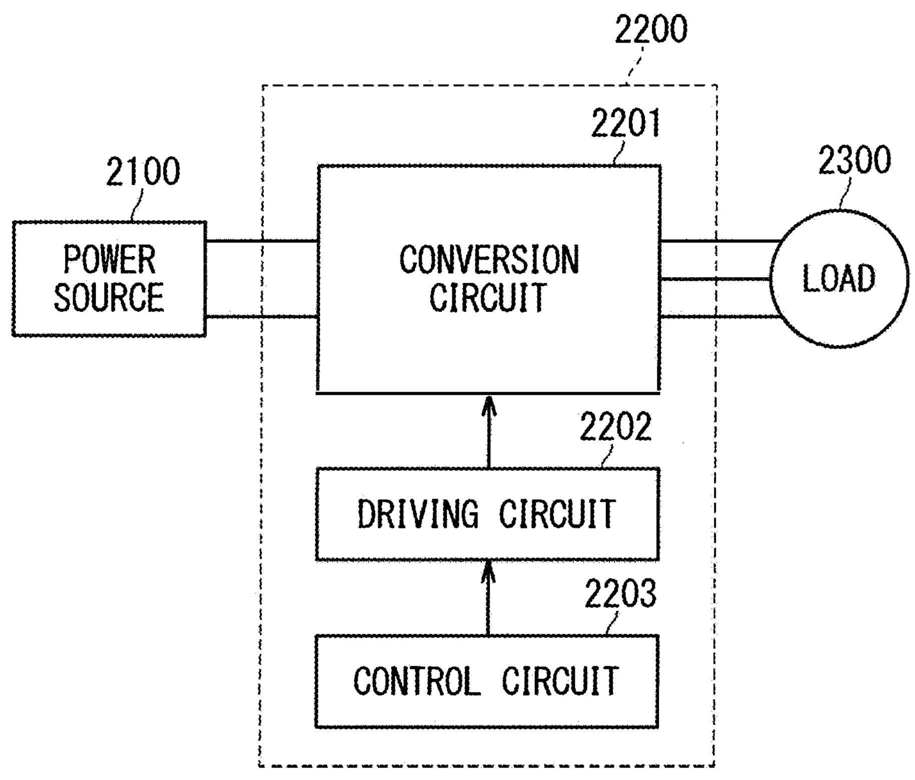
FIG. 13 is a diagram conceptually showing an example of a configuration of a power conversion system including a power converter according to one embodiment.

FIG. 13 is a diagram conceptually showing an example of a configuration of a power conversion system that includes the power converter according to the present embodiment.

As illustrated by way of example in FIG. 13, the power conversion system includes a power source 2100, a power converter 2200, and a load 2300. The power source 2100 is a direct-current power supply and supplied direct-current power to the power converter 2200. The power source 2100 may be configured by various components, and may be configured as, for example, a direct-current system, a solar cell, or an electrical storage battery. The power source 2100 may also be configured as a rectifier circuit or an AC-DC converter that is connected to an alternating-current system. As another alternative, the power source 2100 may be configured as a DC-DC converter that converts direct-current power output from a direct-current system into predetermined electric power.

The power converter 2200 is a three-phase inverter connected between the power source 2100 and the load 2300. The power converter 2200 converts the direct-current power supplied from the power source 2100 into alternating-current power and supplies the alternating-current power to the load 2300.

As illustrated by way of example in FIG. 13, the power converter 2200 includes a conversion circuit 2201 that converts direct-current power into alternating-current power and outputs the alternating-current power, a driving circuit 2202 that outputs a driving signal for driving stitching elements of the conversion circuit 2201, and a control circuit 2203 that outputs a control signal for controlling the driving circuit 2202 to the driving circuit 2202.

The load 2300*b* is a three-phase electric motor that is driven by the alternating-current power supplied from the power converter 2200. Note that the load 2300 is not limited to the one for particular use and serves as an electric motor that is mounted on various types of electrical equipment, and may, for example, be used as an electric motor for a hybrid automobile, an electric automobile, a railway vehicle, an elevator, or an air conditioner.

Details of the power converter 2200 will be described hereinafter. The conversion circuit 2201 includes switching elements and freewheeling diodes (not shown). When the switching elements perform switching operations, the conversion circuit 2201 converts the direct-current power supplied from the power source 2100 into alternating-current power and supplies the alternating-current power to the load 2300.

Although the conversion circuit 2201 may have any of various specific circuit configurations, the conversion circuit 2201 according to the present embodiment is a 2-level three-phase full-bridge circuit that includes six switching elements and six freewheeling diodes that are connected respectively in inverse parallel with the six switching elements.

The silicon carbide semiconductor device according to any of the embodiments described above is applied to at least either of the switching elements and the freewheeling diodes of the conversion circuit 2201. Each two of the six switching elements are connected in series and constitute upper and lower arms, and each pair of upper and lower arms constitutes each phase (i.e., U phase, V phase, and W phase)

of the full-bridge circuit. The output terminals for each pair of upper and lower arms (i.e., three output terminals of the conversion circuit 2201) are connected to the load 2300.

The driving circuit 2202 generates a driving signal for driving each switching element of the conversion circuit 2201 and supplies the driving signal to the control electrode of each switching element of the conversion circuit 2201. Specifically, the driving circuit 2202 outputs either a driving signal for turning a switching element on or a driving signal for turning a switching element off to the control electrode of each switching element, on the basis of the control signal output from the control circuit 2203 described later.

In the case of maintaining a switching element in the ON state, the driving signal is a voltage signal higher than or equal to a threshed voltage of the switching element (i.e., ON-state signal), and in the case of maintaining a switching element in the OFF state, the driving signal is a voltage signal less than or equal to the threshold voltage of the switching element (i.e., OFF-state signal).

The control circuit 2203 controls the switching elements of the conversion circuit 2201 such that desired electric power is supplied to the load 2300. Specifically, the control circuit 2203 calculates, on the basis of the electric power to be supplied to the load 2300, the time at which each switching element of the conversion circuit 2201 is to be turned on (i.e., turn-on time). For example, the conversion circuit 2201 may be controlled under PWM control in which the turn-on time of each switching element is modulated in accordance with the voltage to be output.

Then, the control circuit 2203 outputs a control command (i.e., control signal) to the driving circuit 2202 so that an ON-state signal is output to a switching element that is to be turned on, and an OFF-state signal is output to a switching element that is to be turned off at each point in time. The driving circuit 2202 outputs, on the basis of the control signal, either a ON-state signal or an OFF-state signal as a driving signal to the control electrode of each switching element.

The power converter 2200 according to the present embodiment can stabilize the on-state resistance after a current-carrying cycle because the silicon carbide semiconductor device according to any of the embodiments described above is applied as each switching element of the conversion circuit 2201.

Note that, although the present embodiment describes an example in which the silicon carbide semiconductor device according to any of the embodiments described above is applied to a 2-level three-phase inverter, the example of the application is not limited to this example, and the silicon carbide semiconductor device according to any of the embodiments described above is applicable to any of various power converters.

Although the present embodiment describes about a 2-level power converter, the silicon carbide semiconductor device according to any of the embodiments described above may be applied to a 3-level or multilevel power converter. As another alternative, in the case of supplying electric power to a single-phase load, the silicon carbide semiconductor device according to any of the embodiments described above may be applied to a single-phase invertor.

In the case of supplying electric power to a direct-current load or the like, the silicon carbide semiconductor device according to any of the embodiments described above may be applied to a DC-DC converter or an AC-DC converter.

The power converter to which the silicon carbide semiconductor device according to any of the embodiments described above is applied is not limited to the case in which the aforementioned load is an electric motor, and may be used as a power supply device of, for example, an electric discharge machine, a laser processing machine, an induction heating cooking appliance, or a non-contact power supply system. The power converter to which the silicon carbide semiconductor device according to any of the embodiments described above is applied may also be used as a power conditioner in, for example, a photovoltaic power generating system or an electric condenser system.

Method of Manufacturing Power Converter

Next, the method of manufacturing the power converter according to the present embodiment will be described.

First, the silicon carbide semiconductor device is manufactured by any of the manufacturing methods described in the embodiments given above. Then, the conversion circuit 2201 that includes the silicon carbide semiconductor device is provided as a component of the power converter. The conversion circuit 2201 is a circuit for converting and outputting input power.

Then, the driving circuit 2202 is provided as a component of the power converter. The driving circuit 2202 is a circuit for outputting driving signals for driving the silicon carbide semiconductor device to the silicon carbide semiconductor device. Then, the control circuit 2203 is provided as a component of the power converter. The control circuit 2203 is a circuit for outputting a control signal for controlling the driving circuit 2202 to the driving circuit 2202.

The semiconductor switching element used in the embodiment described above is not limited to a switching element of a silicon (Si) semiconductor, and may, for example, be a non-Si semiconductor material that has a wider bandgap than the Si semiconductor.

Examples of the wide-bandgap semiconductor used as the non-Si semiconductor material include silicon carbide, gallium nitride materials, and diamond.

Switching elements of a wide-bandgap semiconductor are usable even in high-voltage regions where an Si semiconductor has difficulty in unipolar operations, and can significantly reduce switching losses that may occur during switching operations. This allows a significant reduction in power loss.

Switching elements of a wide-bandgap semiconductor also have low power loss and high heat resistance. Thus, in the case of configuring a power module that includes a cooler, it is possible to reduce the size of a cooling fin of a heat sink. This allows a reduction in the size of the semiconductor module.

Switching elements of a wide-bandgap semiconductor are also suitable for high-frequency switching operations. Thus, in the case where the switching elements are applied to a converter circuit that has high demand for higher frequency, it is possible to reduce the size of, for example, a reactor or a capacitor that is connected to the converter by increasing switching frequencies.

Accordingly, the semiconductor switching elements according to the embodiments described above achieve similar effects even when formed into the switching elements of a wide-gap semiconductor such as silicon carbide.

Effects Achieved by Embodiments Described Above

Next, an example of the effects achieved by the embodiments described above will be described. Note that, although in the following description, the effects are described based on specific configurations illustrated by way of example in the embodiments described above, the specific configurations may be replaced by other specific configurations described by way of example in the specification of the present application within the range in which similar effects can be achieved.

This replacement may be made astraddle a plurality of embodiments. That is, similar effects may be achieved by any combination of the configurations described by way of example in different embodiments.

According to the embodiments described above, the silicon carbide semiconductor device includes the silicon carbide semiconductor substrate of the first conductivity type, the semiconductor layer of the first conductivity type, and the backside electrode. The silicon carbide semiconductor substrate as used herein may correspond to, for example, the silicon carbide monocrystalline substrate 31. The semiconductor layer may correspond to, for example, the epitaxial growth layer 34. The backside electrode may corresponds to, for example, any one of the backside electrodes 20, 320, 520, and 720 (for the sake of convenience, any one of them may be used in the following description). The epitaxial growth layer 34 is formed on the upper surface of the silicon carbide monocrystalline substrate 31. The backside electrode 20 is formed on the lower surface of the silicon carbide monocrystalline substrate 31. Here, the region in which field-effect transistors are formed in the surface layer of the epitaxial growth layer 34 and on the upper surface of the epitaxial growth layer 34 is referred to as the active region 5. The region that surrounds the active region 5 in plan view is referred to as the termination region 6. The region in which electric resistivity between the silicon carbide monocrystalline substrate 31 and the backside electrode 20 takes a first value is referred to as a first resistance region. The first resistance region as used herein may correspond to, for example, the low-resistance region 7. The region in which the electric resistivity between the silicon carbide monocrystalline substrate 31 and the backside electrode 20 takes a second value higher than the first value is referred to as a second resistance region. The second resistance region as used herein may correspond to, for example, the high-resistance region 8. The high-resistance region 8 is a region that extends across a region boundary, i.e., the boundary between the active region 5 and the termination region 6, in plan view. The region boundary as used herein may correspond to, for example, the boundary A.

According to this configuration, the high-resistance region 8 is provided in the range that extends across the boundary A between the active region 5 and the termination region 6 in plan view. Thus, it is possible to suppress local occurrences of a large current in the vicinity of the boundary A during the passage of current through the body diode of the SiC-MOSFET. Accordingly, it is possible to suppress fluctuations in device characteristics of the SiC-MOSFET without impairing the productivity of the SiC-MOSFET.

Note that similar effects can also be achieved even in the case where any other configuration described by way of example in the specification of the present application is appropriately added to the configuration described above, i.e., the case where any other configuration that is described in the specification of the present application but is not referred to in the configuration described above is appropriately added.

According to the embodiments described above, the distance Di in plan view between the boundary A and the edge of the high-resistance region 8 that is included in the active region 5 in plan view satisfies $T \leq Di \leq T \times 10$, and the distance Do in plan view between the boundary A and the edge of the high-resistance region 8 that is included in the termination region 6 in plan view satisfies $T \leq Do$, where T is the total thickness of the silicon carbide monocrystalline substrate 31 and the epitaxial growth layer 34. With this configuration, it is possible to effectively suppress local occurrences of a large current in the vicinity of the boundary A during the passage of current through the body diode of the SiC-MOSFET.

According to the embodiments described above, the high-resistance region 8 extends over the whole of the termination region 6. With this configuration, it is possible to suppress local occurrences of a large current in the vicinity of the boundary A during the passage of current through the body diode of the SiC-MOSFET.

According to the embodiments described above, the contact resistivity between the silicon carbide monocrystalline substrate 31 and the backside electrode 20 in the high-resistance region 8 is higher than the contact resistivity between the silicon carbide monocrystalline substrate 31 and the backside electrode 20 in the low-resistance region 7. With this configuration, it is possible to suppress local occurrences of a large current in the vicinity of the boundary A during the passage of current through the body diode of the SiC-MOSFET.

According to the embodiments described above, in the high-resistance region 8, ohmic contact is not established between the silicon carbide monocrystalline substrate 31 and the backside electrode 20 (or the backside electrode 520 or 720). With this configuration, it is possible to suppress local occurrences of a large current in the vicinity of the boundary A during the passage of current through the body diode of the SiC-MOSFET by relatively increasing the contact resistivity in the high-resistance region 8.

According to the embodiments described above, in the low-resistance region 7, ohmic contact is established by the silicide formed between the silicon carbide monocrystalline substrate 31 and the backside electrode 20 (or the backside electrode 320 or 520). With this configuration, it is possible to suppress local occurrences of a large current in the vicinity of the boundary A during the passage of current through the body diode of the SiC-MOSFET by relatively lowering the contact resistivity in the low-resistance region 7.

According to the embodiments described above, the silicon carbide semiconductor device includes the impurity region of the second conductivity type that is formed in the surface layer on the lower surface side of the silicon carbide monocrystalline substrate 31 and overlaps with the high-resistance region 8 in plan view. The impurity region as used herein may correspond to, for example, any of the ion-implanted regions 40 and 340. With this configuration, it is possible to suppress local occurrences of a large current in the vicinity of the boundary A during the passage of current through the body diode of the SiC-MOSFET by relatively increasing the contact resistivity in the high-resistance region 8.

According to the embodiments described above, the ion-implanted region 340 includes a first impurity layer and a second impurity layer having a different impurity concentration from the impurity concentration of the first impurity layer. The first impurity layer and the second impurity layer as used herein may correspond to, for example, any two of the ion-implanted layers 40*a*, 40*b*, 40*c*, and 40*d*. With this configuration, it is possible to suppress local occurrences of a large current in the vicinity of the boundary A during the passage of current through the body diode of the SiC- MOSFET by relatively increasing the contact resistivity in the high-resistance region 8. Besides, it is also possible to precisely control the current density in the epitaxial growth layer 34 by dividing the impurity layer in the ion-implanted region 340 into multiple stages.

According to the embodiments described above, the backside electrode 720 includes a first metal layer that is provided overlapping with the low-resistance region 7, and a second metal layer that is provided overlapping with the high-resistance region 8 and contains a different type of metal from the metal of the first metal layer. The first metal layer as used herein may correspond to, for example, the backside electrode layer 721. The second metal layer as used herein may correspond to, for example, the backside electrode layer 722. With this configuration, it is possible to effectively suppress local occurrences of a large current in the vicinity of the boundary A during the passage of current through the body diode of the SiC-MOSFET.

According to the embodiments described above, the electric resistivity between the silicon carbide monocrystalline substrate 31 and the backside electrode 20 changes continuously from the low-resistance region 7 to the high-resistance region 8. With this configuration, it is possible to effectively suppress local occurrences of a large current in the vicinity of the boundary A during the passage of current through the body diode of the SiC-MOSFET. Besides, it is also possible to precisely control uniformity in current density in the epitaxial growth layer 34.

According to the embodiments described above, the silicon carbide semiconductor device includes the silicon carbide monocrystalline substrate 31, the epitaxial growth layer 34 formed on the upper surface of the silicon carbide monocrystalline substrate 31, and the backside electrode 620 formed on part of the lower surface of the silicon carbide monocrystalline substrate 31. Here, the region in which field-effect transistors are formed in the surface layer of the epitaxial growth layer 34 and on the upper surface of the epitaxial growth layer 34 is referred to as the active region 5. The region that surrounds the active region 5 in plan view is referred to as the termination region 6. The region in which the backside electrode 620 is formed in plan view is referred to as a first region. The first region as used herein may correspond to, for example, the low-resistance region 7. The region in which the backside electrode is not formed in plan view is referred to as a second region. The second region as used herein may correspond to, for example, the high-resistance region 8. The high-resistance region 8 extends across the boundary A, i.e., the boundary between the active region 5 and the termination region 6, in plan view.

With this configuration, it is possible to suppress local occurrences of a large current in the vicinity of the boundary A during the passage of current through the body diode of the SiC-MOSFET, because the high-resistance region 8 in which the backside electrode 620 is not formed is provided in the range across the boundary A between the active region 5 and the termination region 6 in plan view. Accordingly, it is possible to suppress fluctuations in device characteristics of the SiC-MOSFET without impairing the productivity of the SiC-MOSFET.

According to the embodiments described above, the distance Di in plan view between the boundary A and the edge of the high-resistance region 8 that is included in the active region 5 in plan view satisfies $T \leq Di \leq T \times 10$, and the distance Do in plan view between the boundary A and the edge of the high-resistance region 8 that is included in the termination region 6 in plan view satisfies $T \leq Do$, where T is the total thickness of the silicon carbide monocrystalline substrate 31 and the epitaxial growth layer 34. With this configuration, it is possible to effectively suppress local occurrences of a large current in the vicinity of the boundary A during the passage of current through the body diode of the SiC-MOSFET.

According to the embodiments described above, the high-resistance region 8 extends over the whole of the termination region 6. With this configuration, it is possible to suppress local occurrences of a large current in the vicinity of the boundary A during the passage of current through the body diode of the SiC-MOSFET.

According to the embodiments described above, the power converter includes the conversion circuit 2201 that includes the silicon carbide semiconductor device described above and converts and outputs input electric power, the driving circuit 2202 that outputs a driving signal for driving the silicon carbide semiconductor device to the silicon carbide semiconductor device, and the control circuit 2203 that outputs a control signal for controlling the driving circuit 2202 to the driving circuit 2202. With this configuration, it is possible to suppress local occurrences of a large current in the vicinity of the boundary A during the passage of current the body diode of the SiC-MOSFET, because the high-resistance region 8 is provided in the range across the boundary A between the active region 5 and the termination region 6 in plan view. Accordingly, it is possible to suppress fluctuations in device characteristics in the SiC-MOSFET without impairing the productivity of the SiC-MOSFET.

Variations of Embodiments Described Above

The embodiments described above may in some cases describe features such as the quality, material, size, and shape of each constituent element, the relationship of relative positions of constituent elements, and conditions to implement the present invention. However, all of these features are one example in every aspect and are not intended to be limited by these examples.

Accordingly, numerous variations and equivalents that are not exemplified are assumed to fall within the scope of the technique disclosed in the specification of the present application. For example, the scope of the technique is assumed to include cases such as where at least one constituent element is modified, added, or omitted and where at least one constituent element in at least one embodiment is extracted and combined with constituent elements in other embodiments.

When features such as material name are described with no particular indication in the embodiments described above, those materials are assumed to include other additives such as an alloy, as long as no contradiction arises.

Constituent elements whose numbers are described as "one" in the embodiments described above may include those whose numbers are "two or more" as long as no contradiction arises.

Each constituent element in the embodiments described above is perceived as a conceptual unit, and the scope of the technique disclosed in the specification of the present application includes cases such as where one constituent element is configured by a plurality of structural elements, where one constituent element corresponds to part of a given structural element, and where a plurality of constituent elements is included in a single structural element.

Each constituent element in the embodiments described above is assumed to include structural elements that have different structures or shapes as long as the constituent element performs the same function.

The description in the specification of the present application shall be referred to for all purposes relating to the technique of the present application, and nothing in the specification shall be regarded as conventional technology.

Although the embodiments described above have described planar-type MOSFETs, a case is also conceivable in which the present invention is applied to a trench-type MOSFET with trenches formed in the upper surface of the drift layer. In the case where the present invention is applied to a trench-type MOSFET, grooves or trenches are formed in the upper surface of the drift layer, and the gate electrode is embedded in these grooves. The gate electrode is embedded between the bottom and side surfaces of the trench via the gate insulating film.

EXPLANATION OF REFERENCE SIGNS

2, 2A, 2B gate line electrode
3 source electrode
4 surface protection film
5 active region
6 termination region
7 low-resistance region
8 high-resistance region
10 p well region
11 source region
12 contact region
13 gate insulating film
14 gate electrode
15 interlayer insulation film
16 terminal well region
17 high-concentration terminal well region
18 extended terminal well region
19 field insulation film
20, 320, 520, 620, 720 backside electrode
**20*a*, 20*b*, 220, 420, 721, 722** backside electrode layer
21, 21A, 21B, 21C, 221 ohmic contact region
22 non-ohmic contact region
30 silicon carbide epitaxial substrate
31 silicon carbide monocrystalline substrate
32 buffer layer
33 drift layer
34 epitaxial growth layer
40, 340 ion-implanted region
**40*a*, 40*b*, 40*c*, 40*d*** ion-implanted layer
100, 101, 110, 120, 200, 201, 300, 301, 400 SiC-MOSFET
2100 power source
2200 power converter
2201 conversion circuit
2202 driving circuit
2203 control circuit
2300 load

The invention claimed is:

1. A silicon carbide semiconductor device comprising:

a silicon carbide semiconductor substrate of a first conductivity type;

a semiconductor layer of the first conductivity type formed on an upper surface of the silicon carbide semiconductor substrate; and a backside electrode formed on a lower surface of the silicon carbide semiconductor substrate, wherein a region in which a field-effect transistor is formed in a surface layer of the semiconductor layer and on an upper surface of the semiconductor layer is regarded as an active region, a region that surrounds the active region in plan view is regarded as a termination region, a region in which electric resistivity between the silicon carbide semiconductor substrate and the backside electrode takes a first value is regarded as a first resistance region, a region in which the electric resistivity between the silicon carbide semiconductor substrate and the backside electrode takes a second value greater than the first value is regarded as a second resistance region, the second resistance region is a region that extends across a region boundary in plan view, the region boundary being a boundary between the active region and the termination region, the backside electrode is on the lower surface of the silicon carbide semiconductor substrate on the first resistance region and the second resistance region, a distance Di in plan view between the region boundary and an edge of the second resistance region that is included in the active region in plan view satisfies $T \leq Di \leq T \times 10$, and a distance Do between the region boundary and an edge of the second resistance region that is included in the termination region in plan view satisfies $T \leq Do$, where T is a total thickness of the silicon carbide semiconductor substrate and the semiconductor layer.

2. The silicon carbide semiconductor device according to claim 1, wherein the second resistance region is a region that extends over a whole of the termination region.

3. The silicon carbide semiconductor device according to claim 1, wherein contact resistivity between the silicon carbide semiconductor substrate and the backside electrode in the second resistance region is higher than contact resistivity between the silicon carbide semiconductor substrate and the backside electrode in the first resistance region.

4. The silicon carbide semiconductor device according to claim 1, wherein in the second resistance region, ohmic contact is not established between the silicon carbide semiconductor substrate and the backside electrode.

5. The silicon carbide semiconductor device according to claim 1, wherein in the first resistance region, ohmic contact is established by silicide formed between the silicon carbide semiconductor substrate and the backside electrode.

6. The silicon carbide semiconductor device according to claim 1, further comprising:

an impurity region of a second conductivity type formed in a surface layer on a lower surface side of the silicon carbide semiconductor substrate and overlapping with the second resistance region in plan view.

7. The silicon carbide semiconductor device according to claim 6, wherein the impurity region includes:

a first impurity layer; and a second impurity layer having a different impurity concentration from an impurity concentration of the first impurity layer.

8. The silicon carbide semiconductor device according to claim 1, wherein the backside electrode includes:

a first metal layer provided overlapping with the first resistance region; and a second metal layer provided overlapping with the second resistance region and containing a different type of metal from a metal of the first metal layer.

9. The silicon carbide semiconductor device according to claim 1, wherein electric resistivity between the silicon carbide semiconductor substrate and the backside electrode changes continuously from the first resistance region to the second resistance region.

10. A power converter comprising:

a conversion circuit that includes the silicon carbide semiconductor device according to claim 1 and converts and outputs input electric power;

a driving circuit that outputs a driving signal for driving the silicon carbide semiconductor device to the silicon carbide semiconductor device; and a control circuit that outputs a control signal for controlling the driving circuit to the driving circuit.

11. A silicon carbide semiconductor device comprising:

a silicon carbide semiconductor substrate;

a semiconductor layer formed on an upper surface of the silicon carbide semiconductor substrate; and a backside electrode formed on part of a lower surface of the silicon carbide semiconductor substrate, wherein a region in which a field-effect transistor is formed in a surface layer of the semiconductor layer and on an upper surface of the semiconductor layer is regarded as an active region, a region that surrounds the active region in plan view is regarded as a termination region, a region in which the backside electrode is formed in plan view is regarded as a first region, a region in which the backside electrode is not formed in plan view is regarded as a second region, the second region is a region that extends across a region boundary in plan view, the region boundary being a boundary between the active region and the termination region, a distance Di in plan view between the region boundary and an edge of the second region that is included in the active region in plan view satisfies $T \leq Di \leq T \times 10$, and a distance Do in plan view between the region boundary and an edge of the second region that is included in the termination region in plan view satisfies $T \leq Do$, when T is a total thickness of the silicon carbide semiconductor substrate and the semiconductor layer.

12. The silicon carbide semiconductor device according to claim 11, wherein the second region is a region that extends over a whole of the termination region.

13. A power converter comprising:

a conversion circuit that includes the silicon carbide semiconductor device according to claim 11 and converts and outputs input electric power;

a driving circuit that outputs a driving signal for driving the silicon carbide semiconductor device to the silicon carbide semiconductor device; and a control circuit that outputs a control signal for controlling the driving circuit to the driving circuit.

14. A power converter, comprising:

a conversion circuit that includes a silicon carbide semiconductor device and converts and outputs input electric power;

a driving circuit that outputs a driving signal for driving the silicon carbide semiconductor device to the silicon carbide semiconductor device; and a control circuit that outputs a control signal for controlling the driving circuit to the driving circuit, wherein the silicon carbide semiconductor device includes:

a silicon carbide semiconductor substrate of a first conductivity type;

a semiconductor layer of the first conductivity type formed on an upper surface of the silicon carbide semiconductor substrate; and a backside electrode formed on a lower surface of the silicon carbide semiconductor substrate, wherein a region in which a field-effect transistor is formed in a surface layer of the semiconductor layer and on an upper surface of the semiconductor layer is regarded as an active region, a region that surrounds the active region in plan view is regarded as a termination region, a region in which electric resistivity between the silicon carbide semiconductor substrate and the backside electrode takes a first value is regarded as a first resistance region, a region in which the electric resistivity between the silicon carbide semiconductor substrate and the backside electrode takes a second value greater than the first value is regarded as a second resistance region, the second resistance region is a region that extends across a region boundary in plan view, the region boundary being a boundary between the active region and the termination region, a distance Di in plan view between the region boundary and an edge of the second resistance region that is included in the active region in plan view satisfies $T \leq Di \leq T \times 10$, and a distance Do between the region boundary and an edge of the second resistance region that is included in the termination region in plan view satisfies $T \leq Do$, where T is a total thickness of the silicon carbide semiconductor substrate and the semiconductor layer.

* * * * *